US012615795B2

(12) United States Patent
Lung et al.

(10) Patent No.: US 12,615,795 B2
(45) Date of Patent: Apr. 28, 2026

(54) SEMICONDUCTOR DEVICE AND FORMATION METHOD THEREOF

(71) Applicant: TAIWAN SEMICONDUCTOR MANUFACTURING COMPANY, LTD., Hsinchu (TW)

(72) Inventors: Chun-Ming Lung, Hsinchu (TW); Chung-Ting Ko, Kaohsiung (TW); Ting-Hsiang Chang, New Taipei (TW); Sung-En Lin, Hsinchu County (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 482 days.

(21) Appl. No.: 18/190,691

(22) Filed: Mar. 27, 2023

(65) Prior Publication Data

US 2024/0128364 A1 Apr. 18, 2024

Related U.S. Application Data

(60) Provisional application No. 63/417,053, filed on Oct. 18, 2022.

(51) Int. Cl.
| | |
|---|---|
| *H01L 29/775* | (2006.01) |
| *H01L 29/06* | (2006.01) |
| *H01L 29/40* | (2006.01) |
| *H01L 29/423* | (2006.01) |
| *H01L 29/66* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |

(52) U.S. Cl.
CPC ........... *H10D 30/43* (2025.01); *H10D 30/014* (2025.01); *H10D 30/6735* (2025.01); *H10D 62/121* (2025.01); *H10D 64/01* (2025.01)

(58) Field of Classification Search
CPC .. H10D 30/43; H10D 30/014; H10D 30/6735; H10D 62/121; H10D 64/01; H10D 30/6757; H10D 62/151; H10D 84/0151; H10D 84/017; H10D 84/0188; H10D 84/038; H10D 84/83; H10D 84/85
USPC ........................................................ 257/401
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |

(Continued)

*Primary Examiner* — Tong-Ho Kim
(74) *Attorney, Agent, or Firm* — Maschoff Brennan

(57) ABSTRACT

A semiconductor device includes a fin structure, a metal gate stack, a barrier structure and an epitaxial source/drain region. The fin structure is over a substrate. The metal gate stack is across the fin structure. The barrier structure is on opposite sides of the metal gate stack. The barrier structure comprises one or more passivation layers and one or more barrier layers, and the one or more passivation layers have a material different from a material of the one or more barrier layers. The epitaxial source/drain region is over the barrier structure.

20 Claims, 47 Drawing Sheets

(56)                    References Cited

U.S. PATENT DOCUMENTS

|  |  |  |  |
|---|---|---|---|
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2018/0315840 A1* | 11/2018 | Chui | H01L 21/02312 |
| 2020/0006476 A1* | 1/2020 | Chao | H10D 30/43 |
| 2020/0105869 A1* | 4/2020 | Loubet | H10D 62/151 |

* cited by examiner 204C
202C
204B
202B
204A
202A
223
221

206

208

100

204C
202C
204B
202B
204A
202A

203

238

208

100

SEMICONDUCTOR DEVICE AND FORMATION METHOD THEREOF

CROSS-REFERENCE TO RELATED APPLICATION

This application claims priority to U.S. Provisional Patent Application Ser. No. 63/417,053, filed Oct. 18, 2022, which is herein incorporated by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
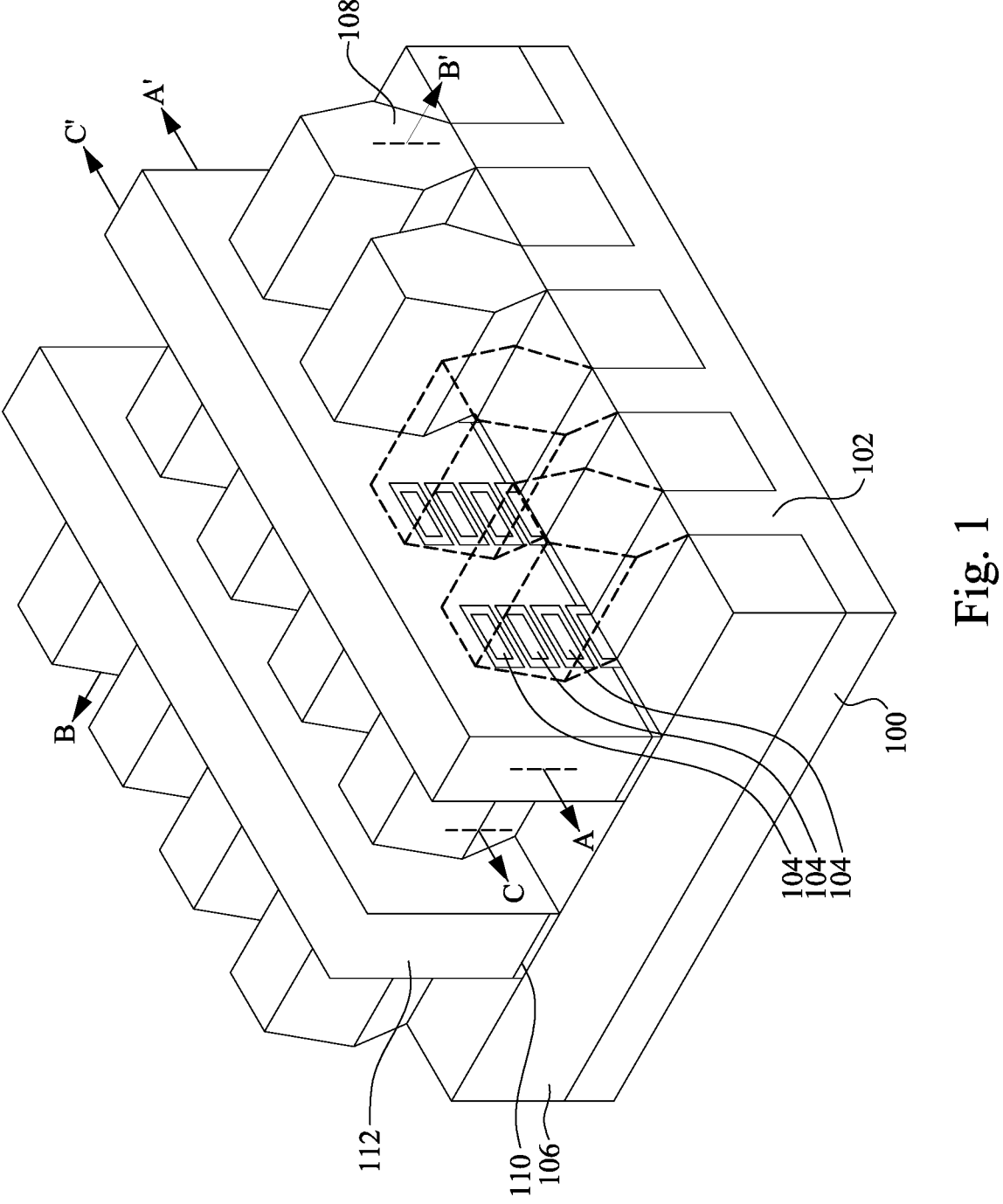
FIG. 1 illustrates an example of gate-all-around field-effect transistors (GAA-FETs) in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 230 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated.

A gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In the present disclosure, a method for forming a barrier structure under source/drain regions for a gate-all-around (GAA) FET and a stacked channel FET are provided. In this disclosure, a source/drain refers to a source and/or a drain. It is noted that in the present disclosure, a source and a drain are interchangeably used and the structures thereof are substantially the same. By disposing the barrier structure, the source/drain regions are prevented from being in direct contact with the substrate. The formed barrier structure provides full isolation of the source/drain regions from the substrate or the fin, thereby effectively reducing a mesa leakage between adjacent source/drain regions and a parasitic capacitance at the bottommost one of subsequently formed channels.

The barrier structure may be formed in source/drain recesses in which the source/drain regions may be subsequently formed. In the foregoing process, it is difficult to selectively depositing layers on a bottom region of a recess without depositing theses layers on a sidewall region of the recess. Therefore, an additional etch process is required to remove the unwanted layers on the sidewall region, leading to increased fabrication costs due to the added complexity and leading to potential process defects and uniformity issues. In view of this, the present disclosure provides a method for fabricating a barrier structure selectively deposited on a top region and/or a bottom region of a recess in a device. Therefore, an additional etch process can be eliminated, reducing fabrication costs and shortening process time.

The present disclosure is generally related to integrated circuit (IC) structures and methods of forming the same, and more particularly to fabricating GAA transistors having a barrier structure in source/drain regions. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as Fin-FET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel (s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

FIG. 1 illustrates an example of GAA-FETs (e.g., nanowire FETs, nanosheet FETs, or the like) in a three-dimensional view, in accordance with some embodiments. The GAA-FETs comprise nanostructures 104 (e.g., nanosheets, nanowires, nanorings, nanoslabs, or other structures having nanoscale size (e.g., a few nanometers)) over fins 102 on a substrate 100 (e.g., a semiconductor substrate), wherein the nanostructures 104 act as channel regions for the GAA-FETs. The nanostructure 104 may include p-type nanostructures, n-type nanostructures, or a combination thereof. Isolation regions 106 are disposed between adjacent fins 102, which may protrude above and from between neighboring isolation regions 106. Although the isolation regions 106 are described/illustrated as being separate from the substrate 100, as used herein, the term "substrate" may refer to the semiconductor substrate alone or a combination of the semiconductor substrate and the isolation regions. Additionally, although a bottom portion of the fins 102 are illustrated as being single, continuous materials with the substrate 100, the bottom portion of the fins 102 and/or the substrate 100 may comprise a single material or a plurality of materials. In this context, the fins 102 refer to the portion extending between the neighboring isolation regions 106.

Gate dielectrics 110 are over top surfaces of the fins 102 and along top surfaces, sidewalls, and bottom surfaces of the nanostructures 104. Gate electrodes 112 are over the gate dielectrics 110. Epitaxial source/drain regions 108 are disposed on the fins 102 on opposing sides of the gate dielectrics 110 and the gate electrodes 112.

FIG. 1 further illustrates reference cross-sections that are used in later figures. Cross-section A-A' is along a longitudinal axis of a gate electrode 112 and in a direction, for example, perpendicular to the direction of current flow between the epitaxial source/drain regions 108 of a GAA-FET. Cross-section B-B' is perpendicular to cross-section A-A' and is parallel to a longitudinal axis of a fin 102 of the GAA-FET and in a direction of, for example, a current flow between the epitaxial source/drain regions 108 of the GAA-FET. Cross-section C-C' is parallel to cross-section A-A' and extends through epitaxial source/drain regions of the GAA-FETs. Subsequent figures refer to these reference cross-sections for clarity.

Some embodiments discussed herein are discussed in the context of GAA-FETs formed using a gate-last process. In other embodiments, a gate-first process may be used. Also, some embodiments contemplate aspects used in planar devices, such as planar FETs or in fin field-effect transistors (FinFETs).

FIGS. 2 through 5, 6A, 23A, 24A, 25A, 26A, and 27A illustrate reference cross-section A-A' illustrated in FIG. 1 that extends through a gate region along a longitudinal axis of the gate region. FIGS. 6B, 7B, 8B, 9B, 10B, 11B, 12 through 20, 21B, 22B, 23B, 24B, 25B, 26B, and 27B illustrate reference cross-section B-B' illustrated in FIG. 1 that extends through a fin along a longitudinal axis of the fin. FIGS. 7A, 8A, 9A, 10A, 11A, 21A, 22A and 23C illustrate reference cross-section C-C' illustrated in FIG. 1 that extends through source/drain regions along the longitudinal direction of the gate region.

Figure 2:
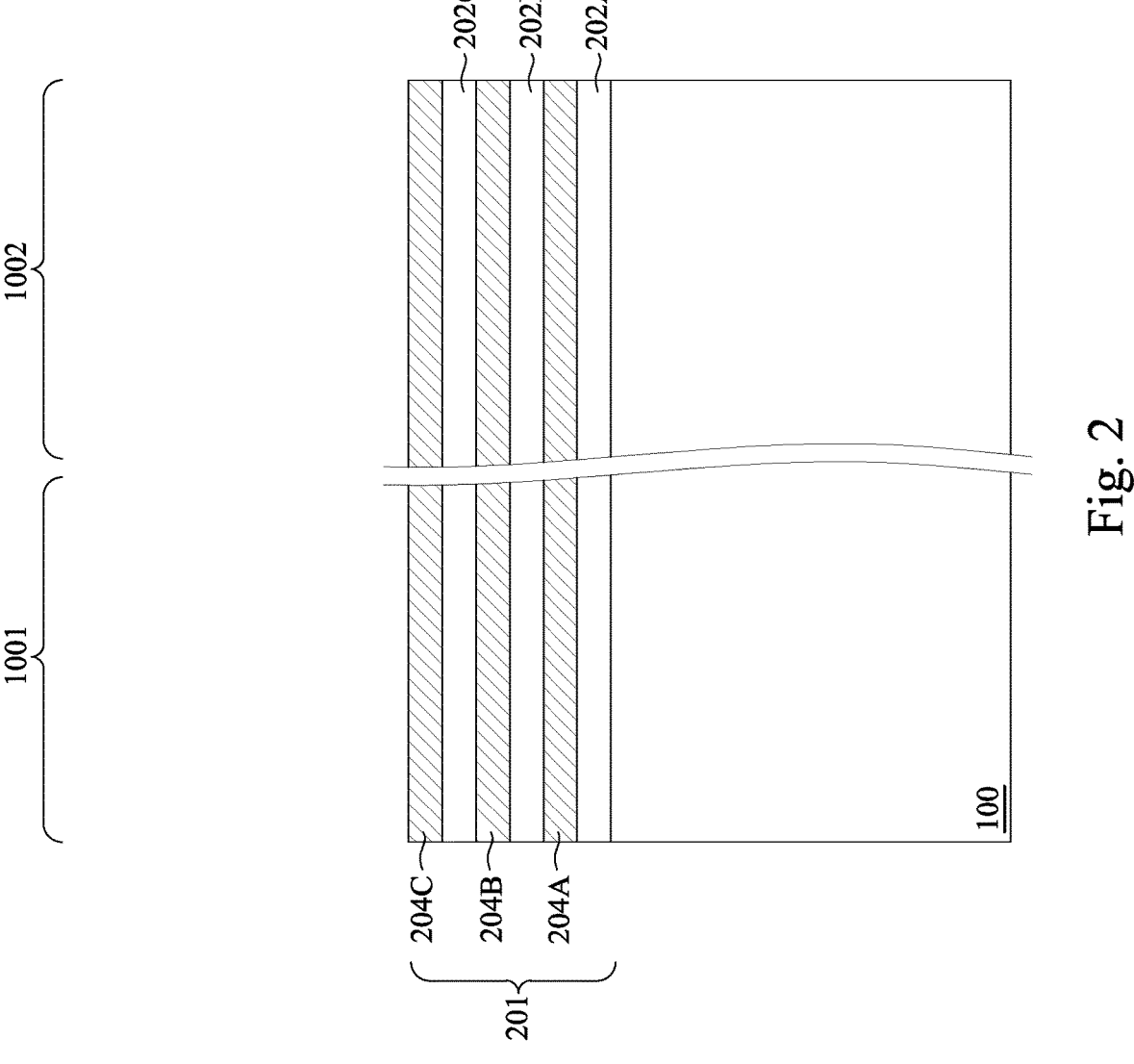
FIGS. 2-5, 6A, 23A, 24A, 25A, 26A, and 27A are cross-sectional views at intermediate fabrication stages, illustrating reference cross-section A-A' illustrated in FIG. 1 that extends through a gate region along a longitudinal axis of the gate region.

In FIG. 2, a substrate 100 is provided. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 100 has a first device region 1001 and a second device region 1002. The first device region 1001 is a region in which first transistors will reside, and the second device region 1002 is a region in which second transistors will reside. In some embodiments, the first transistors are different from the second transistors at least in threshold voltage. For example, first transistors in the first device region 1001 may be HV devices (e.g., I/O devices), and second transistors in the second device region 1002 may be LV devices (e.g., logic devices). In some other embodiments, the first transistors are different from the second transistors at least in conductivity type. For example, first device region 1001 can be for forming n-type devices, such as n-type metal-oxide-semiconductor (NMOS) transistors, e.g., n-type GAA-FETs, and the second device region 1002 can be for forming p-type devices, such as p-type metal-oxide-semiconductor (PMOS) transistors, e.g., p-type GAA-FETs.

The first device region 1001 may be separated from the second device region 1002, and any number of device features (e.g., other active devices, doped regions, isolation structures, etc.) may be disposed between the first device region 1001 and the second device region 1002. Although one first device region 1001 and one second device region 1002 are illustrated, any number of first device regions 1001 and second device regions 1002 may be provided.

Further in FIG. 2, a multi-layer stack 201 is formed over the substrate 100. The multi-layer stack 201 includes alternating layers of first semiconductor layers 202A-C (collectively referred to as first semiconductor layers 202) and second semiconductor layers 204A-C (collectively referred to as second semiconductor layers 204). For purposes of illustration and as discussed in greater detail below, the first semiconductor layers 202 will be removed and the second semiconductor layers 204 will be patterned to form channel regions of GAA-FETs.

The multi-layer stack 201 is illustrated as including three layers of each of the first semiconductor layers 202 and the second semiconductor layers 204 for illustrative purposes. In some embodiments, the multi-layer stack 201 may include any number of the first semiconductor layers 202 and the second semiconductor layers 204. Each of the layers of the multi-layer stack 201 may be epitaxially grown using a process such as chemical vapor deposition (CVD), atomic layer deposition (ALD), vapor phase epitaxy (VPE), molecular beam epitaxy (MBE), or the like. In various embodiments, the second semiconductor layers 204 may be formed of a semiconductor material suitable for serving as channel regions of GAA-FETs, such as silicon, silicon carbon, silicon germanium, or the like.

The first semiconductor materials and the second semiconductor materials may be materials having a high-etch selectivity to one another. As such, the first semiconductor layers 202 of the first semiconductor material may be removed without significantly removing the second semiconductor layers 204 of the second semiconductor material, thereby allowing the second semiconductor layers 204 to serve as channel regions of GAA-FETs.

Figure 3:
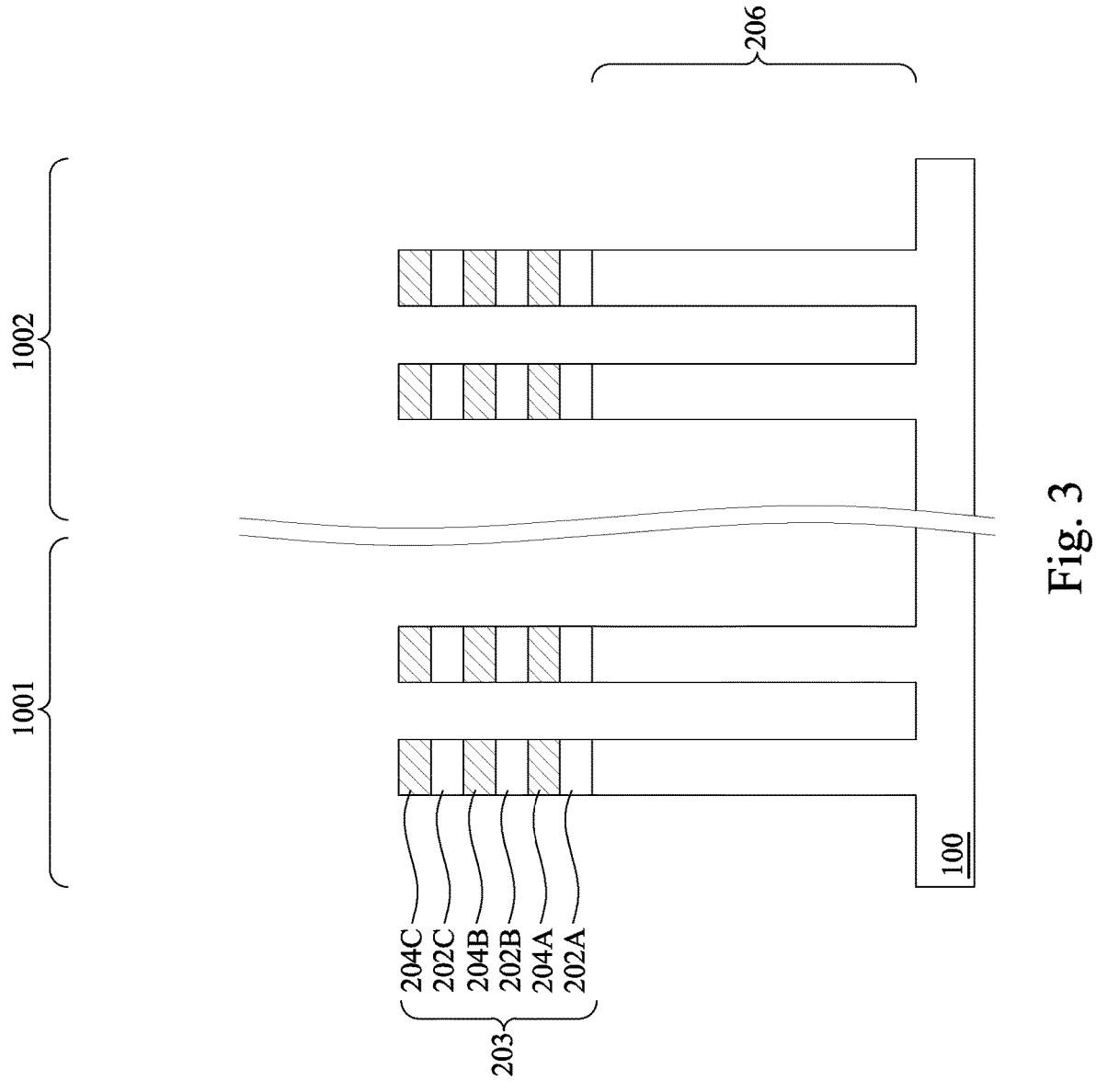

Referring now to FIG. 3, fin structures 206 are formed in the substrate 100 and nanostructures 203 are formed in the multi-layer stack 201, in accordance with some embodiments. In some embodiments, the nanostructures 203 and the fin structures 206 may be formed in the multi-layer stack 201 and the substrate 100, respectively, by etching trenches in the multi-layer stack 201 and the substrate 100. Each fin structure 206 and overlying nanostructures 203 can be collectively referred to as a fin extending from the substrate 100. The etching may be any acceptable etch process, such as a reactive ion etch (RIE), neutral beam etch (NBE), the like, or a combination thereof. The etching may be aniso-tropic. Forming the nanostructures 203 by etching the multi-layer stack 201 may further define first nanostructures 202A-C (collectively referred to as the first nanostructures 202) from the first semiconductor layers 202 and define second nanostructures 204A-C (collectively referred to as the second nanostructures 204) from the second semicon-ductor layers 204. The first nanostructures 202 and the second nanostructures 204 may further be collectively referred to as nanostructures 203.

The fin structures 206 and the nanostructures 203 may be patterned by any suitable method. For example, the fin structures 206 and the nanostructures 203 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 206.

FIG. 3 illustrates the fin structures 206 in the first device region 1001 and the second device region 1002 as having substantially equal widths for illustrative purposes. In some embodiments, widths of the fin structures 206 in the first device region 1001 may be greater or thinner than the fin structures 206 in the second device region 1002. Further, while each of the fin structures 206 and the nanostructures 203 are illustrated as having a consistent width throughout, in other embodiments, the fin structures 206 and/or the nanostructures 203 may have tapered sidewalls such that a width of each of the fin structures 206 and/or the nanostruc-tures 203 continuously increases in a direction towards the substrate 100. In such embodiments, each of the nanostruc-tures 203 may have a different width and be trapezoidal in shape.

Figure 4:
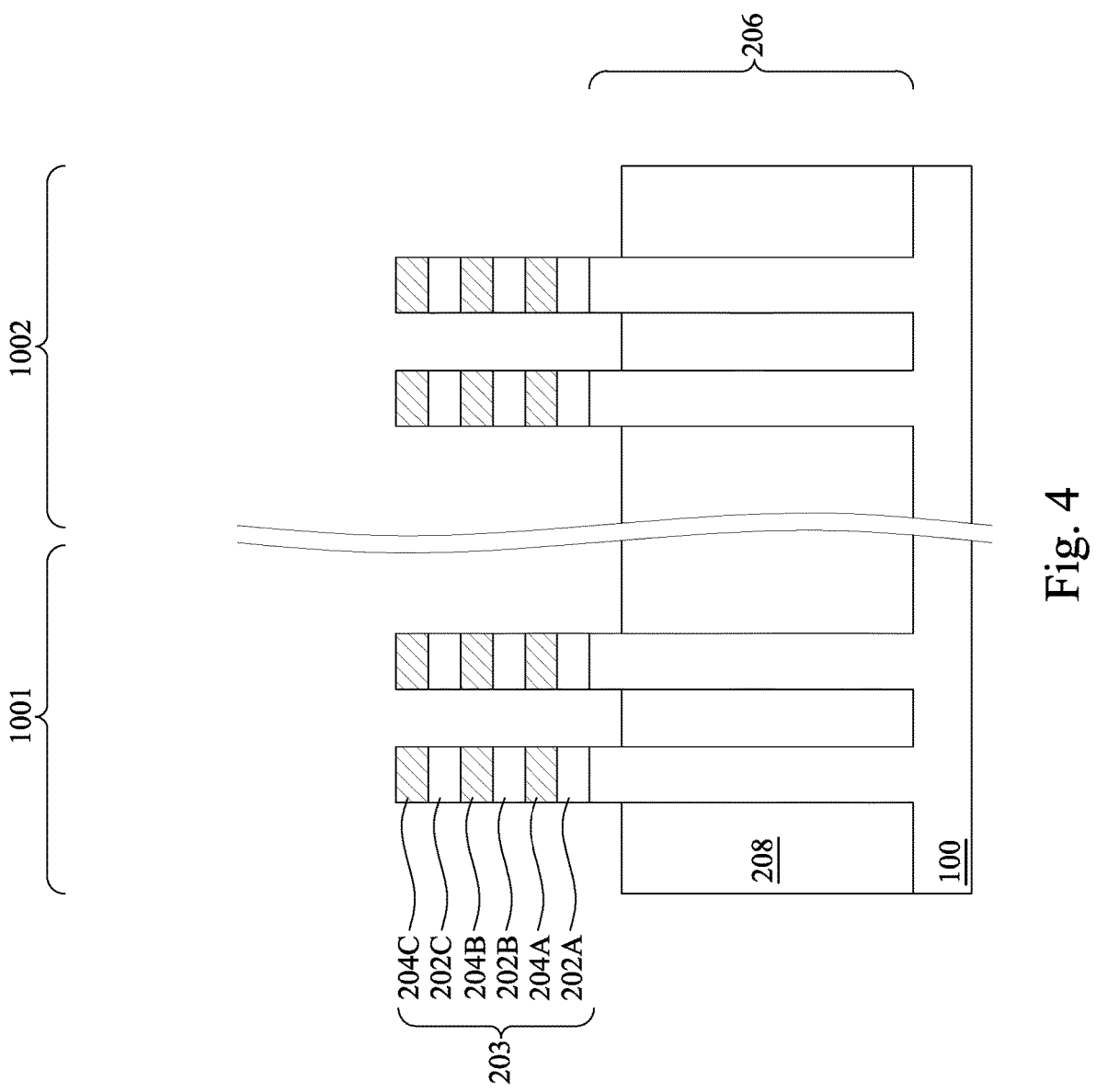

In FIG. 4, shallow trench isolation (STI) regions 208 are formed adjacent the fin structures 206. The STI regions 208 may be formed by depositing an insulation material over the substrate 100, the fin structures 206, and nanostructures 203, and between adjacent fin structures 206. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 203. Although the insulation material is illustrated as a single layer, some embodiments may utilize multiple layers. For example, in some embodiments a liner (not separately illustrated) may first be formed along a surface of the substrate 100, the fin structures 206, and the nanostructures 203. Thereafter, a fill material, such as those discussed above may be formed over the liner.

A removal process is then applied to the insulation material to remove excess insulation material over the nanostructures 203. In some embodiments, a planarization process such as a chemical mechanical polish (CMP), an etch-back process, combinations thereof, or the like may be utilized. The planarization process exposes the nanostruc-tures 203 such that top surfaces of the nanostructures 203 and the insulation material are level after the planarization process is complete.

The insulation material is then recessed to form the STI regions 208. The insulation material is recessed such that upper portions of fin structures 206 in the first and second device regions 1001 and 1002 and protrude from between neighboring STI regions 208. Further, the top surfaces of the STI regions 208 may have a flat surface as illustrated, a convex surface, a concave surface (such as dishing), or a combination thereof. The top surfaces of the STI regions 208 may be formed flat, convex, and/or concave by an appropriate etch. The STI regions 208 may be recessed using an acceptable etching process, such as one that is selective to the material of the insulation material (e.g., etches the material of the insulation material at a faster rate than the material of the fin structures 206 and the nanostructures 203). For example, an oxide removal using, for example, dilute hydrofluoric (dHF) acid may be used.

The process described above with respect to FIGS. 2 through 4 is just one example of how the fin structures 206 and the nanostructures 203 may be formed. In some embodiments, the fin structures 206 and/or the nanostructures 203 may be formed using a mask and an epitaxial growth process. For example, a dielectric layer can be formed over a top surface of the substrate 100, and trenches can be etched through the dielectric layer to expose the underlying substrate 100. Epitaxial structures can be epitaxially grown in the trenches, and the dielectric layer can be recessed such that the epitaxial structures protrude from the dielectric layer to form the fin structures 206 and/or the nanostructures 203. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers (and resulting nanostructures 202) and the second semiconductor layers (and resulting nanostructures 204) are illustrated and discussed herein as comprising the same materials in the second device region 1002 and the first device region 1001 for illustrative purposes only. As such, in some embodiments one or both of the first semiconductor layers and the second semiconductor layers may be different materials or formed in a different order in the first and second device regions 1001 and 1002.

Further in FIG. 4, appropriate wells (not separately illustrated) may be formed in the fin structures 206, the nanostructures 203, and/or the STI regions 208. In some embodiments with different well types in different device regions 1001 and 1002, different implant steps for the first device region 1001 and the second device region 1002 may be achieved using a photoresist or other masks (not separately illustrated). For example, a photoresist may be formed over the fin structures 206 and the STI regions 208 in the first device region 1001 and the second device region 1002. The photoresist is patterned to expose the second device region 1002. The photoresist can be formed by using a spin-on technique and can be patterned using acceptable photolithography techniques. Once the photoresist is patterned, a first impurity (e.g., n-type impurity such as phosphorus, arsenic, antimony, or the like) implant is performed in the second device region 1002, and the photoresist may act as a mask to substantially prevent the first impurities from being implanted into the first device region 1001. After the implant, the photoresist is removed, such as by an acceptable ashing process.

Following or prior to the implanting of the second device region 1002, a photoresist or other masks (not separately illustrated) is formed over the fin structures 206, the nanostructures 203, and the STI regions 208 in the first device region 1001 and the second device region 1002. The photoresist is then patterned to expose the first device region 1001. The photoresist can be formed by using a spin-on technique and can be patterned using acceptable photolithography techniques. Once the photoresist is patterned, a second impurity (e.g., p-type impurity such as boron, boron fluoride, indium, or the like) implant may be performed in the first device region 1001, and the photoresist may act as a mask to substantially prevent p-type impurities from being implanted into the second device region 1002. After the implant, the photoresist may be removed, such as by an acceptable ashing process.

After one or more well implants of the first device region 1001 and the second device region 1002, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
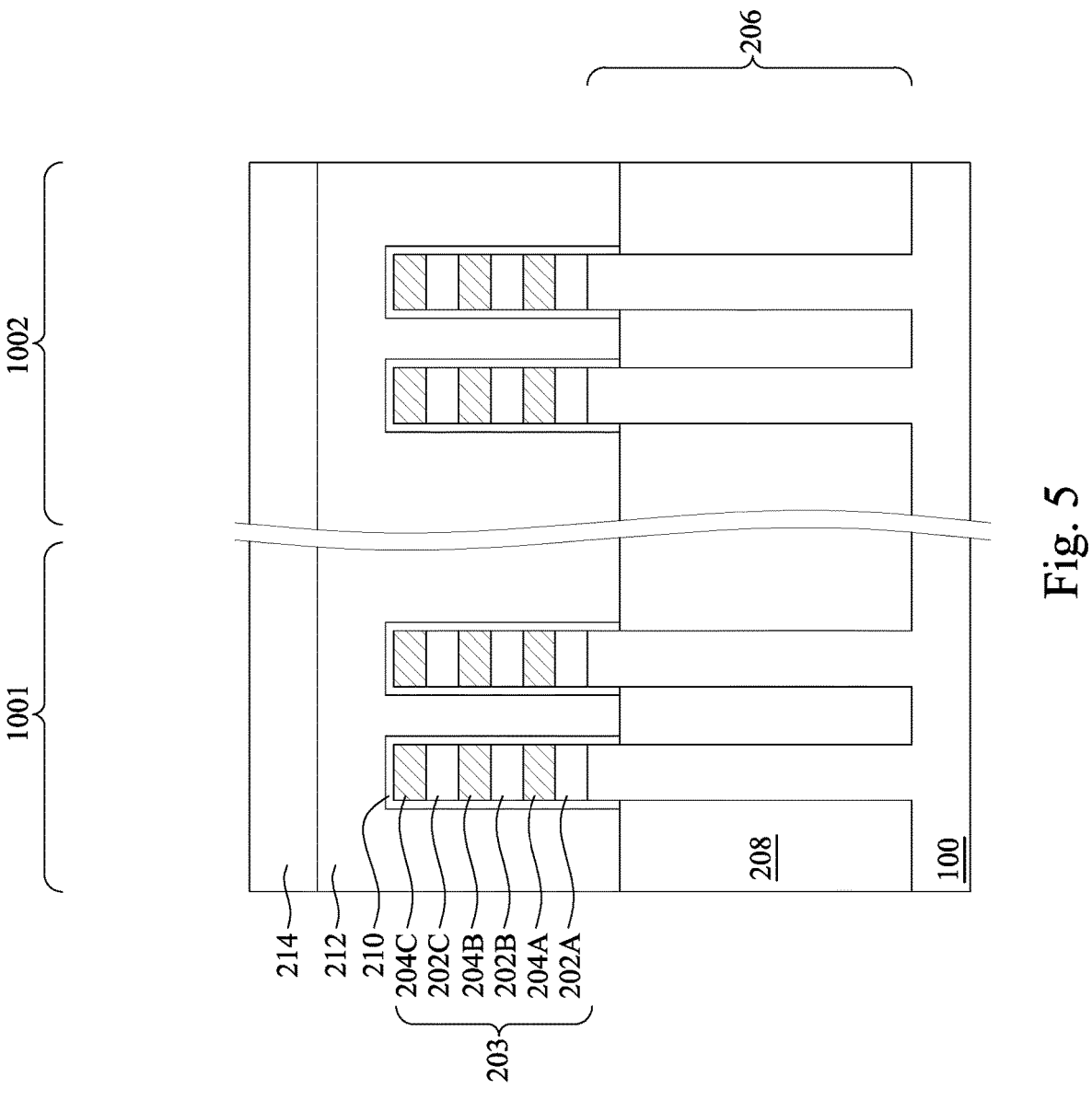

In FIG. 5, a dummy dielectric layer 210 is formed on the fin structures 206 and/or the nanostructures 203. The dummy dielectric layer 210 may be, for example, silicon oxide, silicon nitride, a combination thereof, or the like, and may be deposited or thermally grown according to acceptable techniques. A dummy gate layer 212 is formed over the dummy dielectric layer 210, and a mask layer 214 is formed over the dummy gate layer 212. The dummy gate layer 212 may be deposited over the dummy dielectric layer 210 and then planarized, such as by a CMP. The mask layer 214 may be deposited over the dummy gate layer 212. The dummy gate layer 212 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 212 may be deposited by physical vapor deposition (PVD), CVD, sputter deposition, or other techniques for depositing the selected material. The dummy gate layer 212 may be made of other materials that have a high etching selectivity from the etching of isolation regions. The mask layer 214 may include, for example, silicon nitride, silicon oxynitride, or the like. In this example, a single dummy gate layer 212 and a single mask layer 214 are formed across the first device region 1001 and the second device region 1002. It is noted that the dummy dielectric layer 210 is shown covering only the fin structures 206 and the nanostructures 203 for illustrative purposes only. In some embodiments, the dummy dielectric layer 210 may be deposited such that the dummy dielectric layer 210 covers the STI regions 208, such that the dummy dielectric layer 210 extends between the dummy gate layer 212 and the STI regions 208.

Figure 6A:
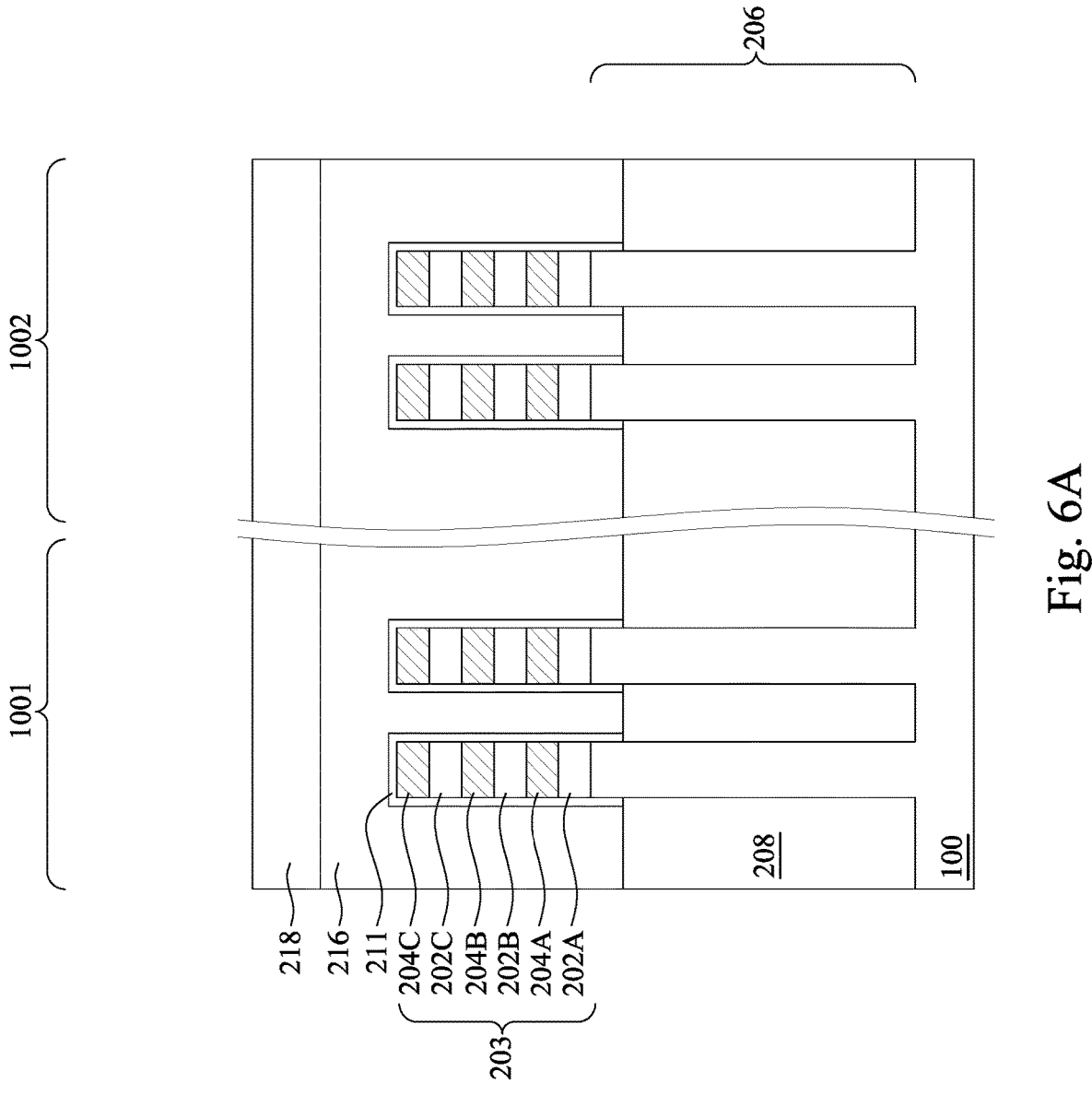
Figure 6B:
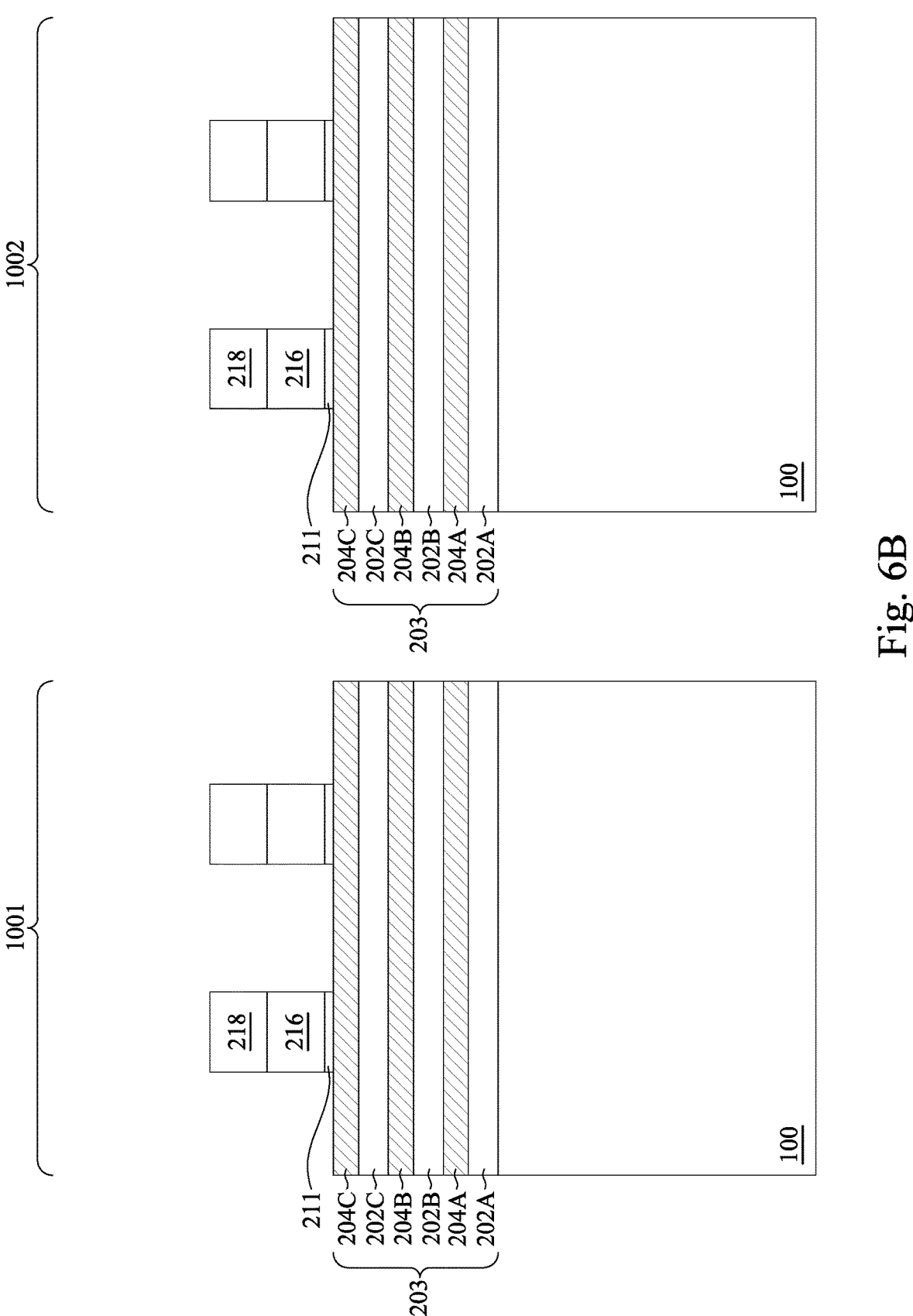
FIGS. 6B, 7B, 8B, 9B, 10B, 11B, 12, 13A, 14 through 20, 21B, 22B, 23B, 24B, 25B, 26B, and 27B are cross-sectional views at intermediate fabrication stages, illustrating reference cross-section B-B' illustrated in FIG. 1 that extends through a fin along a longitudinal axis of the fin.

FIGS. 6A through 27B illustrate various following steps in the manufacturing of embodiment devices. FIGS. 6A, 7A, 8A, 9A, 10A, 11A, 21A, 22A, 23A, 23C, 24A, 25A, 26A and 27A illustrate features in either the first device regions 1001 or the second device regions 1002. In FIGS. 6A and 6B, the mask layer 214 (see FIG. 5) may be patterned using acceptable photolithography and etching techniques to form masks 218. The pattern of the masks 218 then may be transferred to the dummy gate layer 212 and to the dummy dielectric layer 210 to form dummy gates 216 and dummy gate dielectrics 211, respectively. The dummy gates 216 cover respective channel regions of the fin structures 206. The pattern of the masks 218 may be used to physically separate each of the dummy gates 216 from adjacent dummy gates 216. The dummy gates 216 may also have a lengthwise direction substantially perpendicular to the lengthwise direction of respective fin structures 206.

Figure 7A:
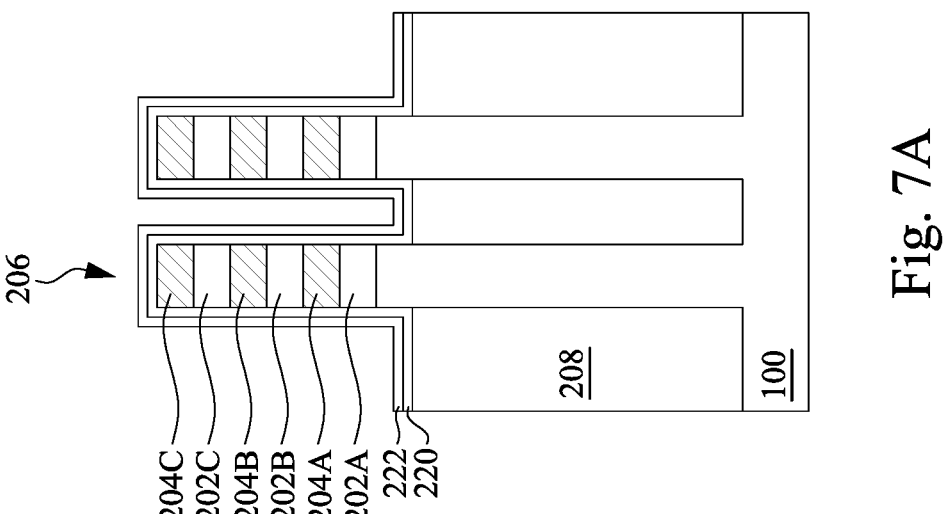
FIGS. 7A, 8A, 9A, 10A, 11A, 21A, 22A and 23C are cross-sectional views at intermediate fabrication stages, illustrating reference cross-section C-C' illustrated in FIG. 1 that extends through source/drain regions along the longitudinal direction of the gate region.
Figure 7B:
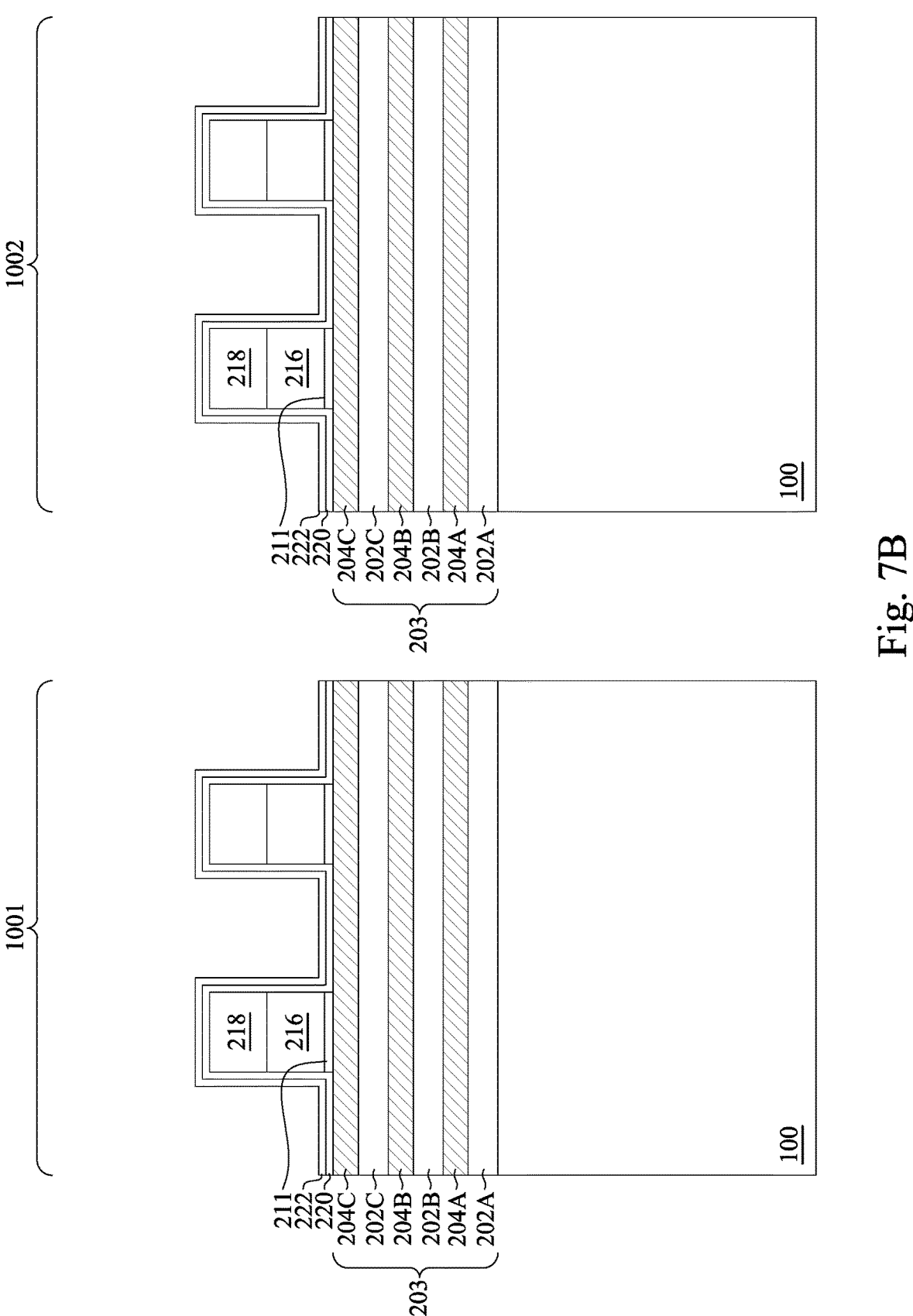

In FIGS. 7A and 7B, a first spacer layer 220 and a second spacer layer 222 are formed over the structures illustrated in FIGS. 6A and 6B, respectively. The first spacer layer 220 and the second spacer layer 222 will be subsequently patterned to act as spacers for forming self-aligned source/drain regions. In FIGS. 7A and 7B, the first spacer layer 220 is formed on top surfaces of the STI regions 208; top surfaces and sidewalls of the fin structures 206, the nanostructures 203, and the masks 218; and sidewalls of the dummy gates 216 and the dummy gate dielectric 211. The second spacer layer 222 is deposited over the first spacer layer 220. The first spacer layer 220 may be formed of silicon oxide, silicon nitride, silicon oxynitride, or the like, using techniques such as thermal oxidation or deposited by CVD, ALD, or the like. The second spacer layer 222 may be formed of a material having a different etch rate than the material of the first spacer layer 220, such as silicon oxide, silicon nitride, silicon oxynitride, or the like, and may be deposited by CVD, ALD, or the like.

Figure 8A:
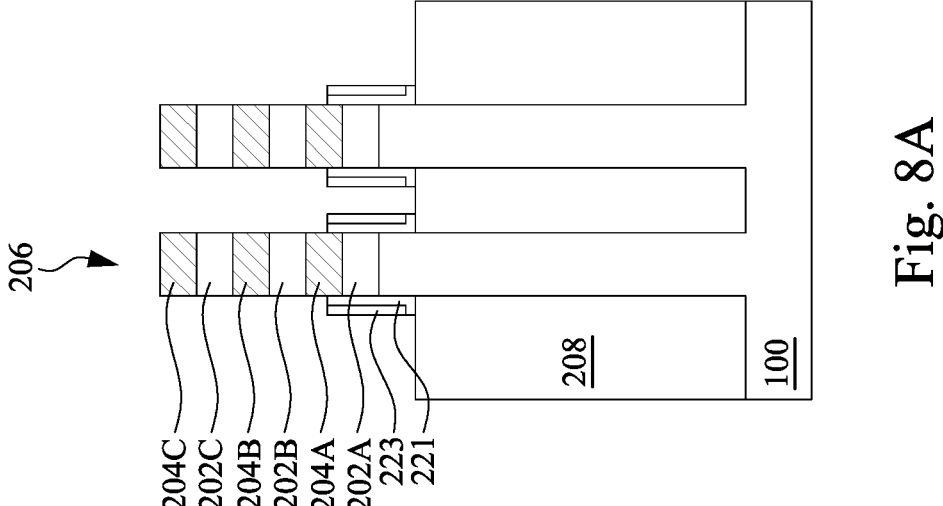
Figure 8B:
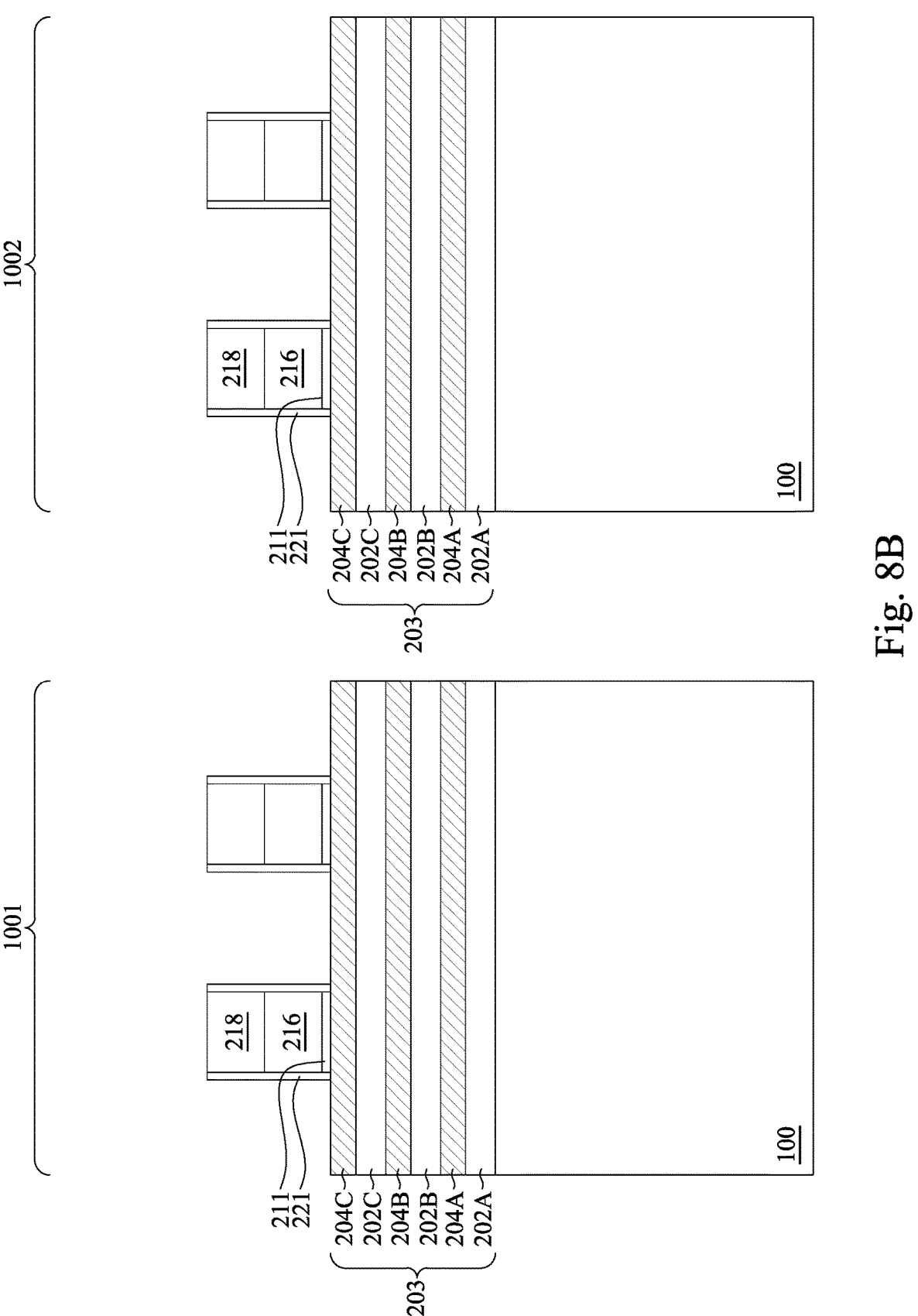

In FIGS. 8A and 8B, the first spacer layer 220 and the second spacer layer 222 are etched to form first spacers 221 and second spacers 223. As will be discussed in greater detail below, the first spacers 221 and the second spacers 223 act to self-align subsequently formed source drain regions, as well as to protect sidewalls of the fin structures 206 and/or nanostructure 203 during subsequent processing. The first spacer layer 220 and the second spacer layer 222 may be etched using a suitable etching process, such as an isotropic etching process (e.g., a wet etching process), an anisotropic etching process (e.g., a dry etching process), or the like. In some embodiments, the material of the second spacer layer 222 has a different etch rate than the material of the first spacer layer 220, such that the first spacer layer 220 may act as an etch stop layer when patterning the second spacer layer 222 and such that the second spacer layer 222 may act as a mask when patterning the first spacer layer 220. For example, the second spacer layer 222 may be etched using an anisotropic etch process wherein the first spacer layer 220 acts as an etch stop layer, wherein remaining portions of the second spacer layer 222 form second spacers 223 as illustrated in FIG. 8A. Thereafter, the second spacers 223 acts as a mask while etching exposed portions of the first spacer layer 220, thereby forming first spacers 221 as illustrated in FIG. 8A.

As illustrated in FIG. 8A, the first spacers 221 and the second spacers 223 are disposed on sidewalls of the fin structures 206 and/or nanostructures 203. In some embodiments, the spacers 221 and 223 only partially remain on sidewalls of the fin structures 206. In some embodiments, no spacer remains on sidewalls of the fin structures 206. As illustrated in FIG. 8B, in some embodiments, the second spacer layer 222 may be removed from over the first spacer layer 220 adjacent the masks 218, the dummy gates 216, and the dummy gate dielectrics 211, and the first spacers 221 are disposed on sidewalls of the masks 218, the dummy gates 216, and the dummy gate dielectrics 211. In other embodiments, a portion of the second spacer layer 222 may remain over the first spacer layer 220 adjacent the masks 218, the dummy gates 216, and the dummy gate dielectrics 211.

The above disclosure generally describes a process of forming spacers. Other processes and sequences may be used. For example, fewer or additional spacers may be utilized, different sequence of steps may be utilized (e.g., the first spacers 221 may be patterned prior to depositing the second spacer layer 222), additional spacers may be formed and removed, and/or the like. Furthermore, devices in first device region 1001 and devices in the second device region 1002 may be formed using different structures and steps.

Figure 9A:
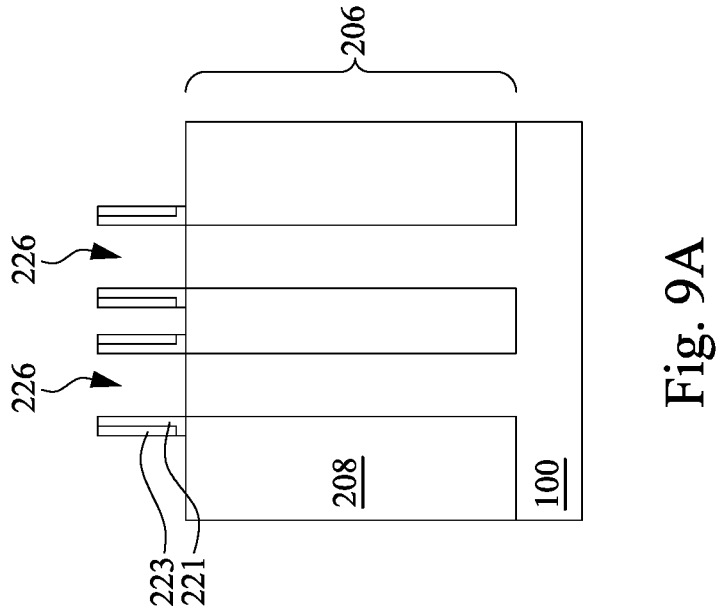
Figure 9B:
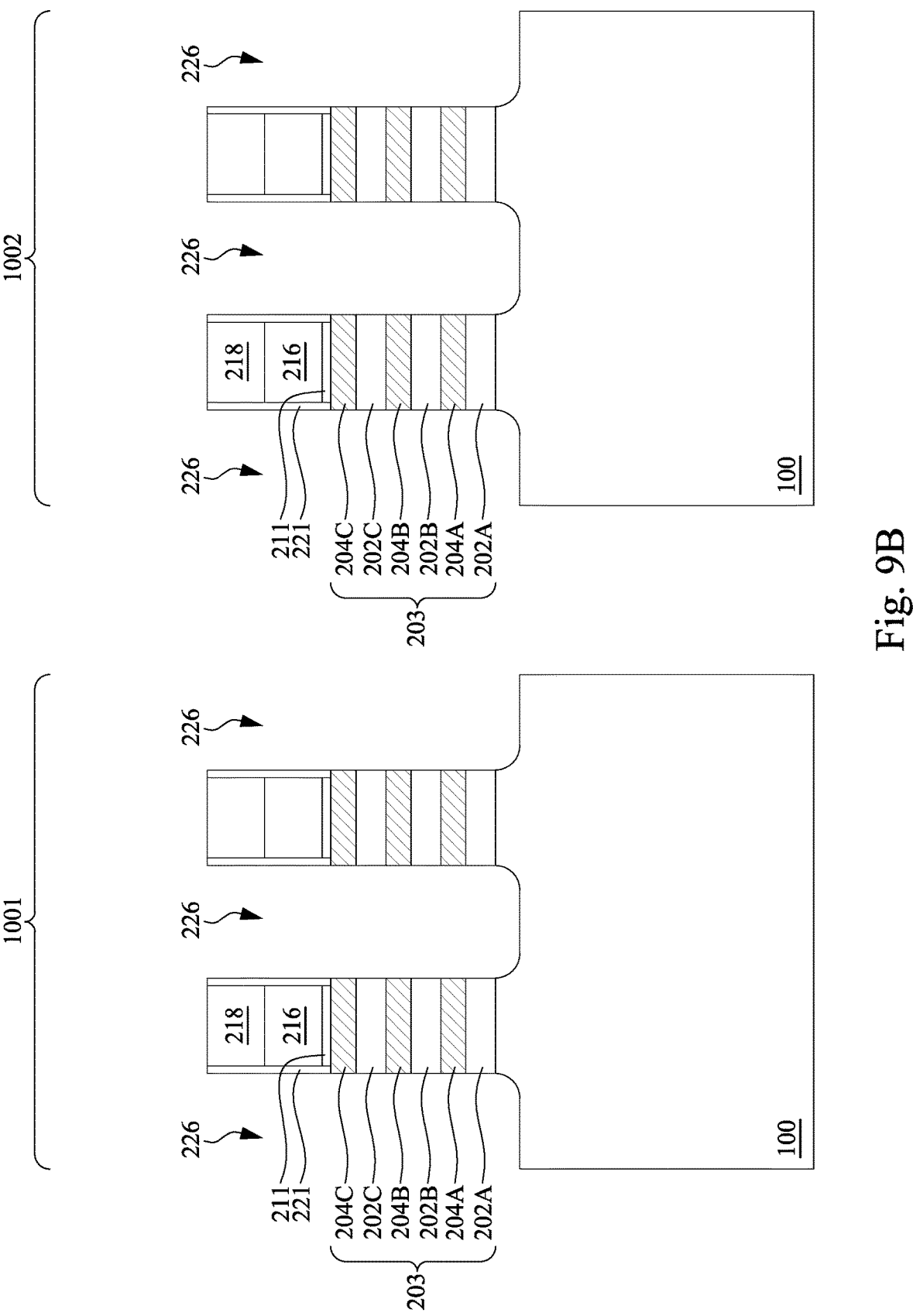

In FIGS. 9A and 9B, source/drain recesses 226 are formed in the fin structures 206, the nanostructures 203, and the substrate 100, in accordance with some embodiments. Epitaxial source/drain regions will be subsequently formed in the source/drain recesses 226. The source/drain recesses 226 may extend through the first nanostructures 202 and the second nanostructures 204, and into the substrate 100. As illustrated in FIG. 9A, bottom surfaces of the source/drain recesses 226 may be level with top surfaces of the STI regions 58, as an example. In some other embodiments, the fin structures 206 may be etched such that bottom surfaces of the source/drain recesses 226 are disposed below the top surfaces of the STI regions 208, or above the top surfaces of the STI regions 208. The source/drain recesses 226 may be formed by etching the fin structures 206, the nanostructures 203, and the substrate 100 using anisotropic etching processes, such as RIE, NBE, or the like. The first spacers 221, the second spacers 223, and the masks 218 mask portions of the fin structures 206, the nanostructures 203, and the substrate 100 during the etching processes used to form the source/drain recesses 226. A single etch process or multiple etch processes may be used to etch each layer of the nanostructures 203 and/or the fin structures 206. Timed etch processes may be used to stop the etching of the source/drain recesses 226 after the source/drain recesses 226 reach a target depth.

Figure 10A:
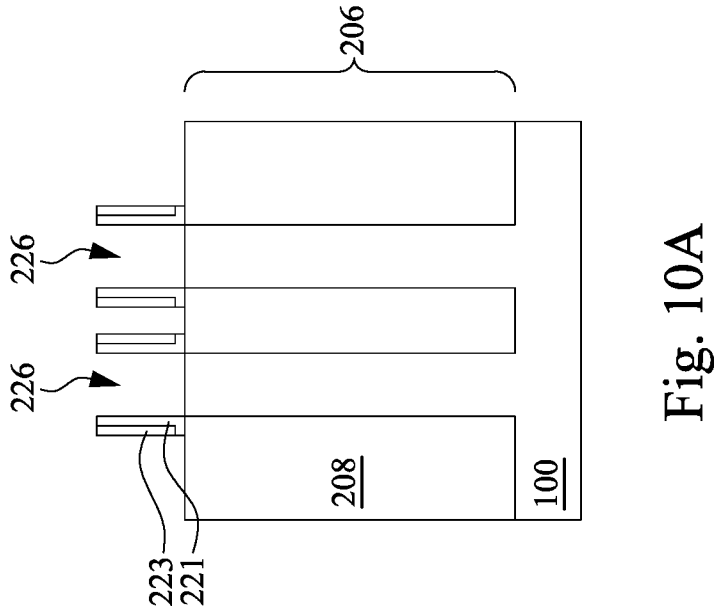
Figure 10B:
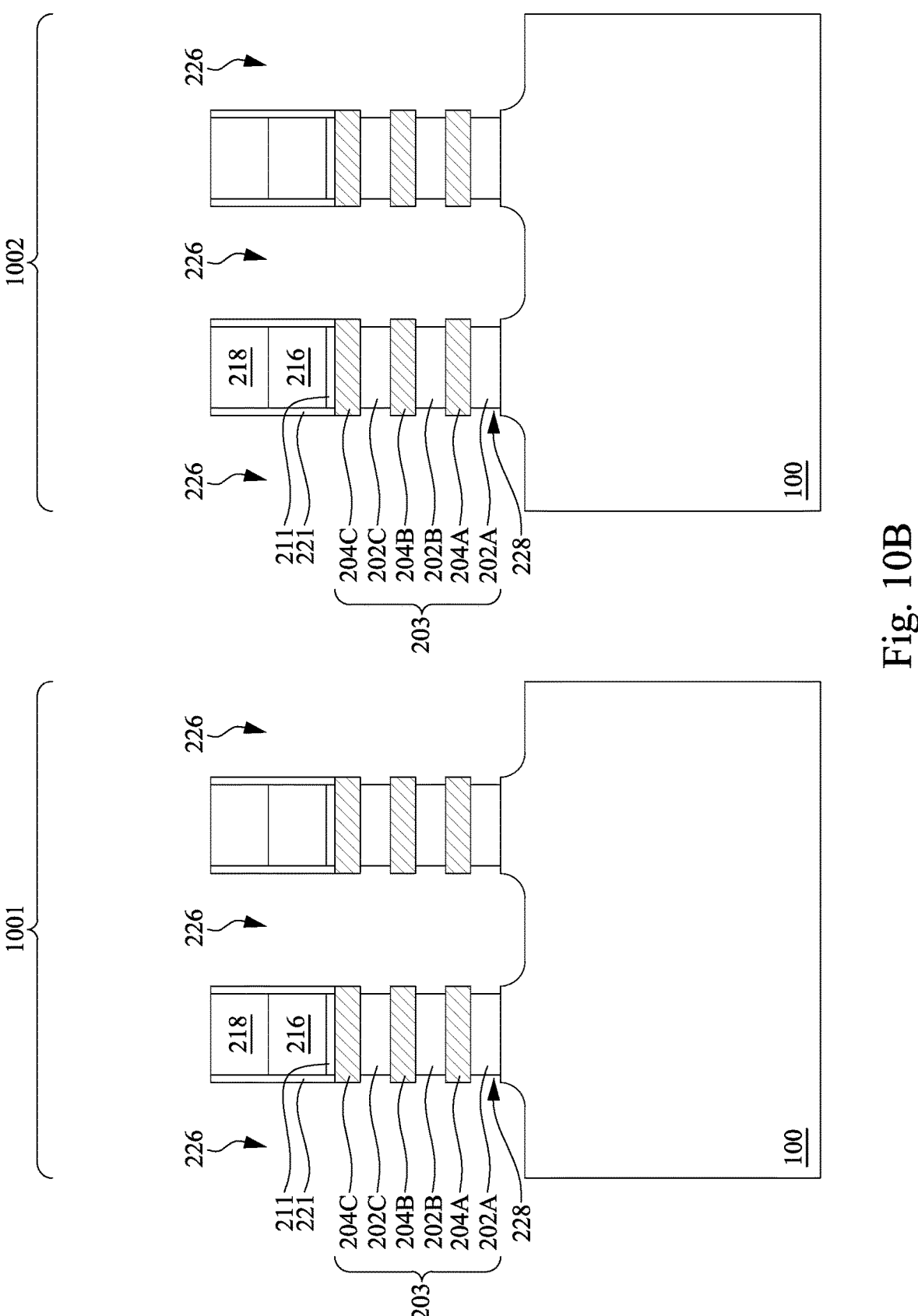

In FIGS. 10A and 10B, portions of sidewalls of the layers of the multi-layer stack 201 formed of the first semiconductor materials (e.g., the first nanostructures 202) exposed by the source/drain recesses 226 are etched to form sidewall recesses 228 between corresponding second nanostructures 204. Although sidewalls of the first nanostructures 202 in the sidewall recesses 228 are illustrated as being straight in FIG. 10B, the sidewalls may be concave or convex. The sidewalls may be etched using isotropic etching processes, such as wet etching or the like. In some embodiments in which the first nanostructures 202 include, e.g., SiGe, and the second nanostructures 204 include, e.g., Si or SiC, a dry etch process with tetramethylammonium hydroxide (TMAH), ammonium hydroxide ($NH_4OH$), or the like may be used to etch sidewalls of the first nanostructures 202.

Figure 11A:
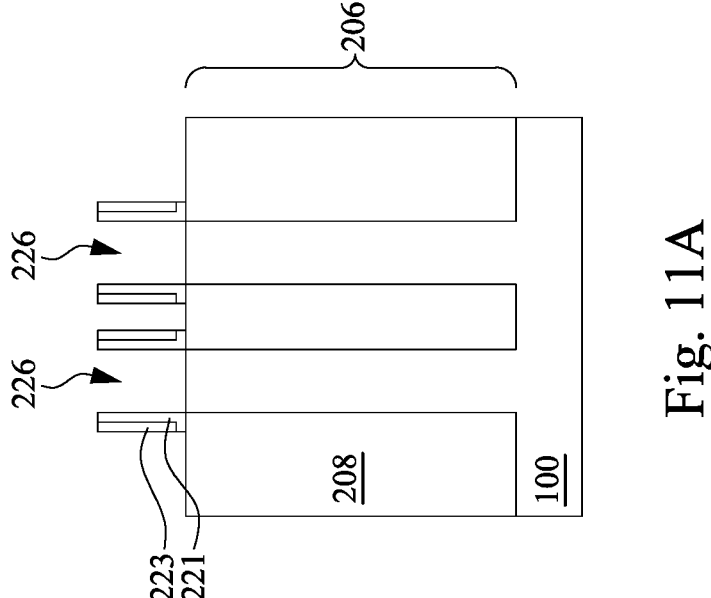
Figure 11B:
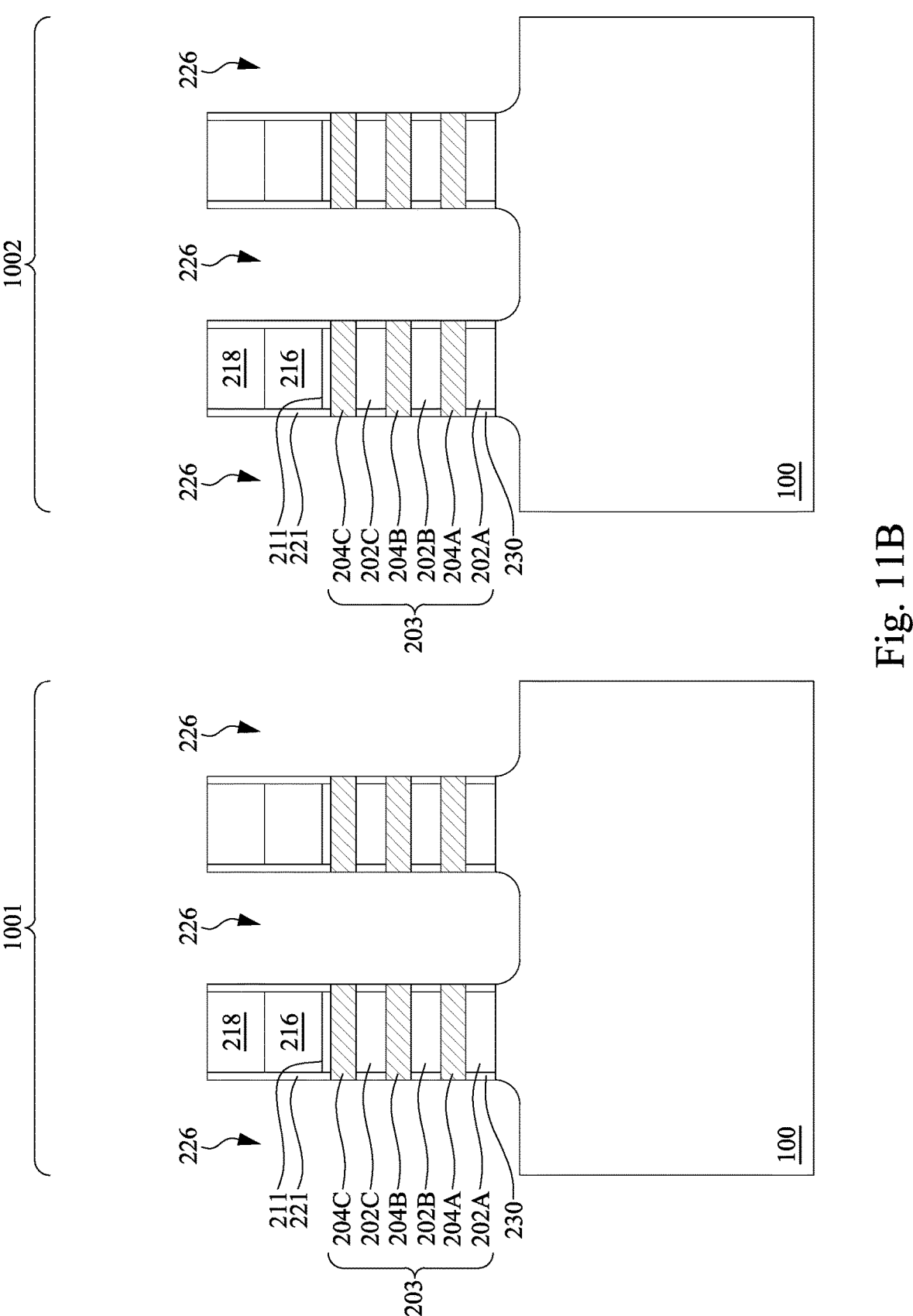

In FIGS. 11A and 11B, inner spacers 230 are formed in the sidewall recess 228. The inner spacers 230 may be formed by depositing an inner spacer layer (not separately illustrated) over the structures illustrated in FIGS. 10A and 10B. The inner spacers 230 act as isolation features between subsequently formed source/drain regions and gate structure. As will be discussed in greater detail below, source/drain regions will be formed in the source/drain recesses 226, and the first nanostructures 202 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 230. Although outer sidewalls of the inner spacers 230 are illustrated as being flush with sidewalls of the second nanostructures 204, the outer sidewalls of the inner spacers 230 may extend beyond or be recessed from sidewalls of the second nanostructures 204.

Moreover, although the outer sidewalls of the inner spacers 230 are illustrated as being straight in FIG. 11B, the outer sidewalls of the inner spacers 230 may be concave or convex. The inner spacer layer may be etched by an anisotropic etching process, such as RIE, NBE, or the like. The inner spacers 230 may be used to prevent damage to subsequently formed source/drain regions (such as the epitaxial source/drain regions 232, discussed below with respect to FIGS. 22A and 22B) by subsequent etching processes, such as etching processes used to form gate structures. Before the formation of the epitaxial source/drain regions 232, a barrier structure is formed in the source/drain recesses 226. Details of formation of the barrier structure will be discussed with reference to FIGS. 12-20, 21A and 21B, in which FIGS. 12-14 show a cycle for the formation of the barrier structure.

Figure 12:
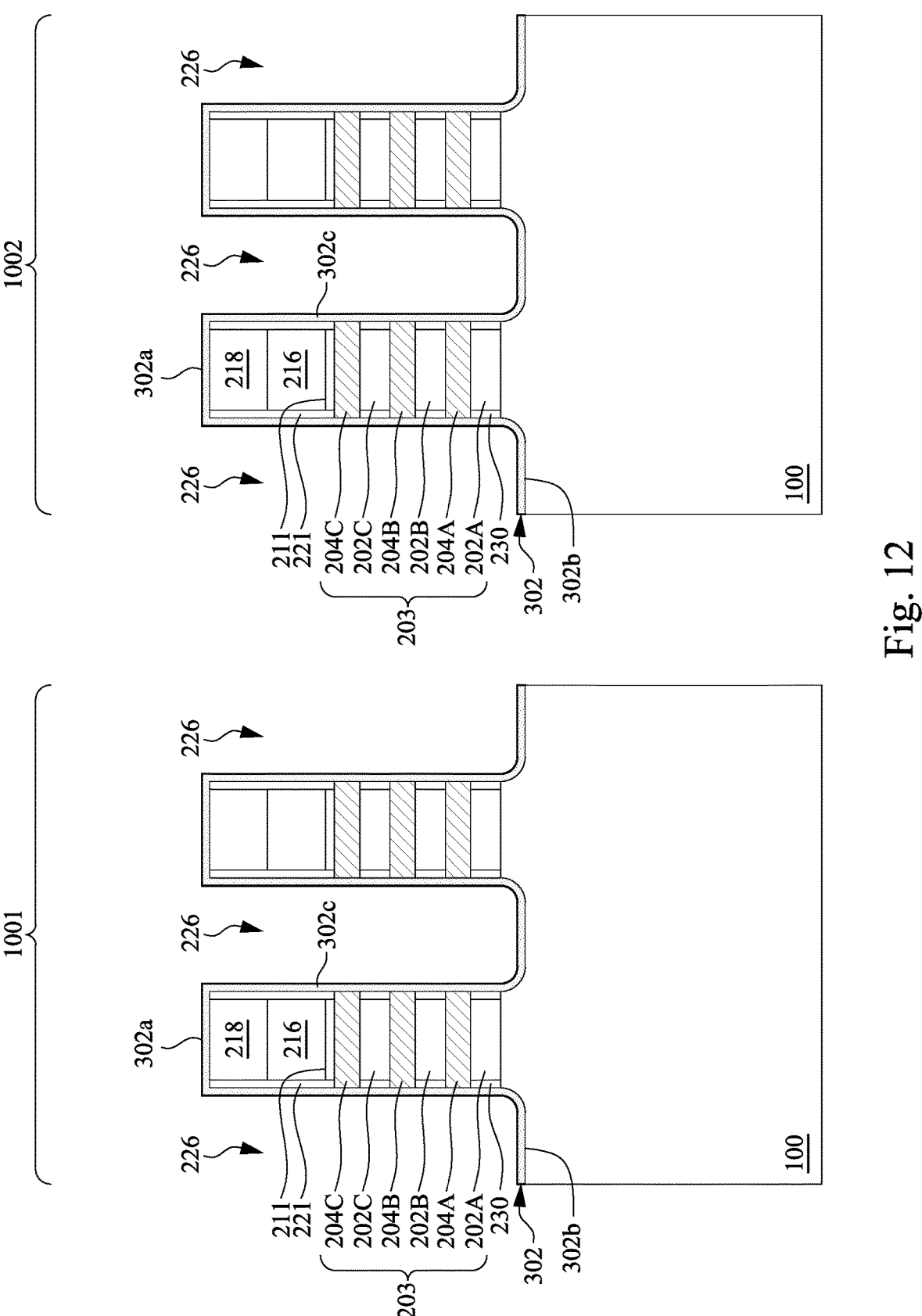

In FIG. 12, a first passivation layer 302 is conformally formed over the structure illustrated in FIG. 11B. The first passivation layer 302 lines the source/drain recesses 226. In other words, the first passivation layer 302 is formed on the top surface of the substrate 100, top surfaces of the masks 218 and extends along the sidewalls of the nanostructures 203 (i.e., the sidewalls of the second semiconductor 204A-C), and the sidewalls of the first spacers 221 and the inner spacers 230. For example, the first passivation layer 302 includes a top passivation portion 302a over the top surface of the dummy gate 216, a bottom passivation portion 302b in contact with the substrate 100, and a lateral passivation portion 302c extending along the sidewall of nanostructure 203 and the sidewall of the dummy gate 216. In some embodiments, the first passivation layer 302 is a dielectric layer, such as an oxide layer (e.g., silicon oxide) and may be formed using atomic layer deposition, plasma-enhanced atomic layer deposition, or the like. The first passivation layer 302 is configured to prevent a subsequently formed barrier layer from forming on the sidewalls of the source/drain recesses 226.

Figure 13A:
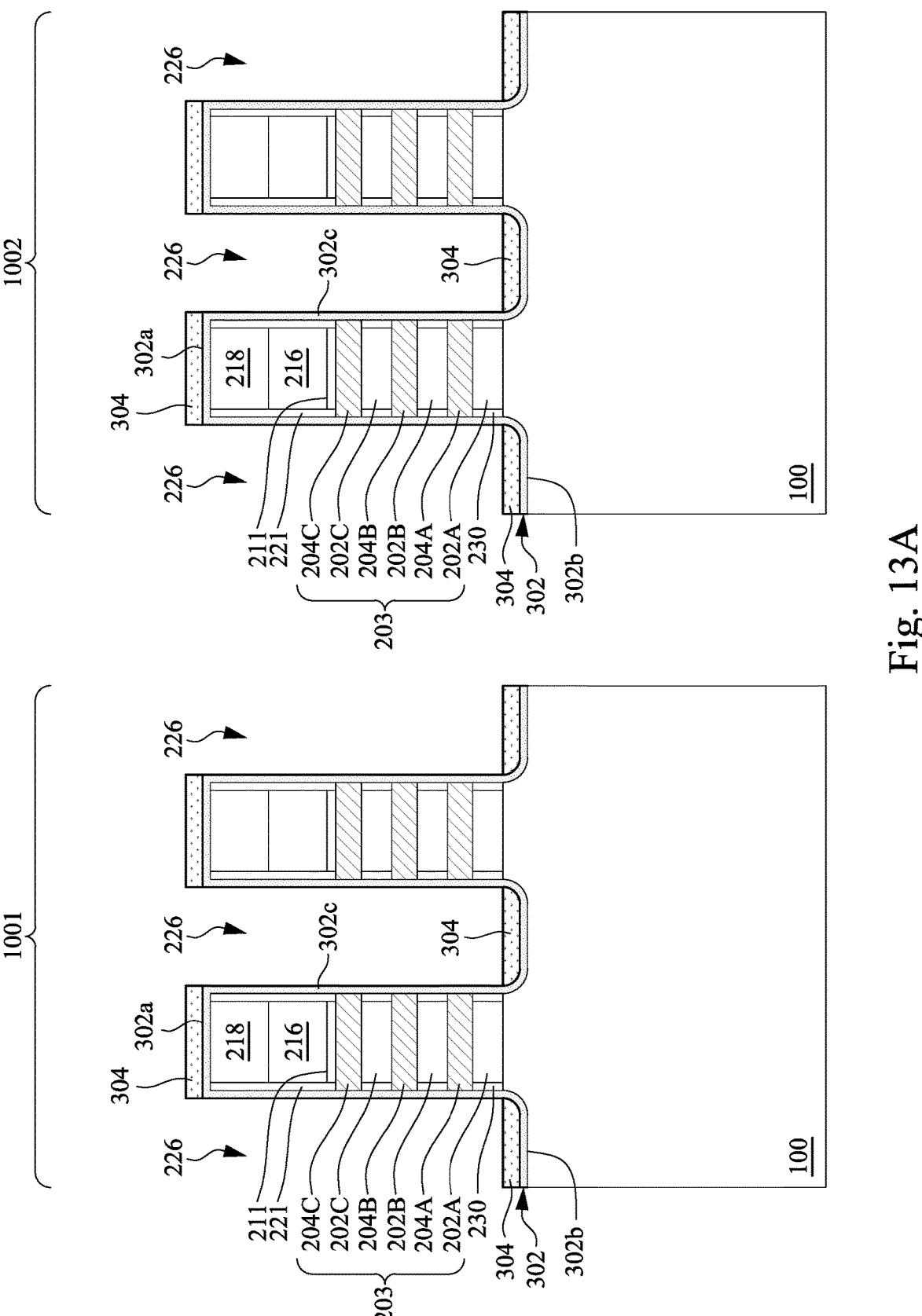
Figure 14:
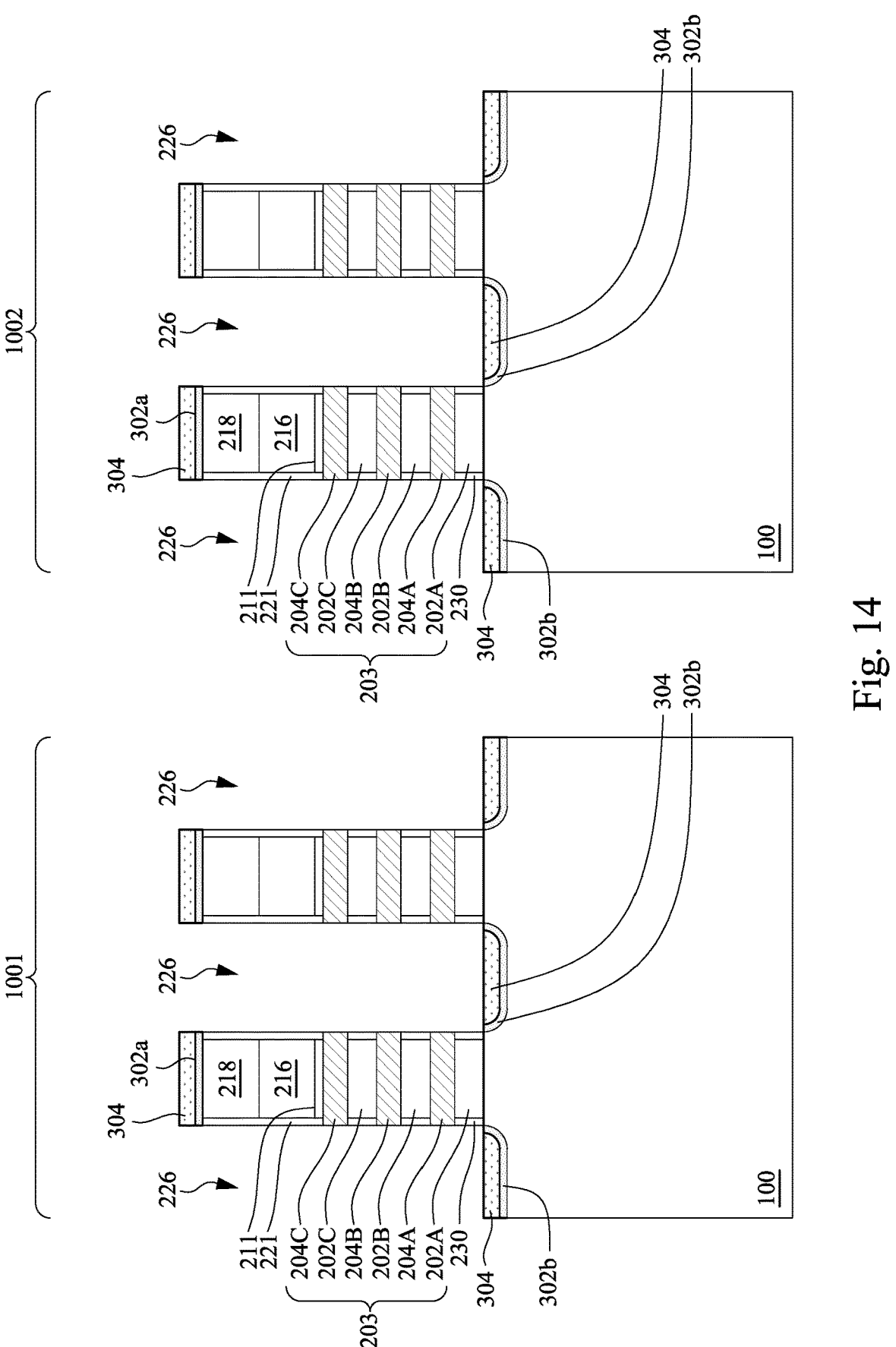

Reference is made to FIG. 13A. First barrier layers 304 are formed on the first passivation layer 302. For example, the first barrier layers 304 are selectively formed on parts of the first passivation layer 302 which are over the top surfaces of the masks 218 and directly over the bottom of the source/drain recesses 226 without forming on the first passivation layer 302 extending along the sidewalls of the source/drain recesses 226. In other words, the first barrier layers 304 are formed on the top passivation portion 302a and on the bottom passivation portion 302b without forming on the lateral passivation portion 302c. In some embodiments, the first barrier layers 304 are formed using a plasma deposition process, such as plasma enhanced atomic layer deposition (PEALD) process. In some embodiments, the first barrier layers 304 are dielectric layers and have a material different from a material of the first passivation layer 302. For example, the first barrier layers 304 are nitride layers such as silicon nitride layers. Under the atomic layer deposition process, one cycle consists of one or more gas flow cycles. In the case of forming the first barrier layers 304 including a silicon nitride film, one cycle consists of supplying and purging of silicon tetraiodide ($SiI_4$) and ammonia ($NH_3$) gases one by one. Depending upon a surface condition, the silicon nitride film may not start until the cycle is repeated at a number of times. It is relatively difficult for silicon nitride to incubate (stat forming) on some dielectric layers such as silicon oxide. One reason for this delay is slow adsorption of the silicon tetraiodide to silicon oxide. When the surface is terminated with OH, the silicon tetraiodide is not adsorbed immediately and film formation starts slowly. As a result, incubation cycles, which refer to the process time, or number of cycles in the case of atomic layer deposition, needed before film formation starts, are increased.

In some embodiments where the first barrier layers 304 are formed using a plasma deposition (e.g., PEALD) process, the incubation cycles (the time for the silicon nitride to start forming) may also be controlled by ion characteristics of the plasma during the plasma deposition process for forming the silicon nitride. The ion characteristics can be controlled by a plasma dosage, a plasma energy, or a plasma pressure. The plasma dosage is affected by a topography of a surface being deposited. During forming the first barrier layers 304 using the plasma deposition in the source/drain recesses 226, a plasma dosage on the sidewall of the source/drain recesses 226 is less than a plasma dosage on the bottom of the source/drain recesses 226 and on the top surface of the masks 218 such that this plasma dosage is not large enough to allow for formation of the first barrier layers on the parts of the first passivation layer 302 extending along the sidewall of the source/drain recesses 226 (i.e., the lateral passivation portion 302c). As a result, the sidewalls of the source/drain recesses 226 are free from the first barrier layers 304.

Figure 13B:
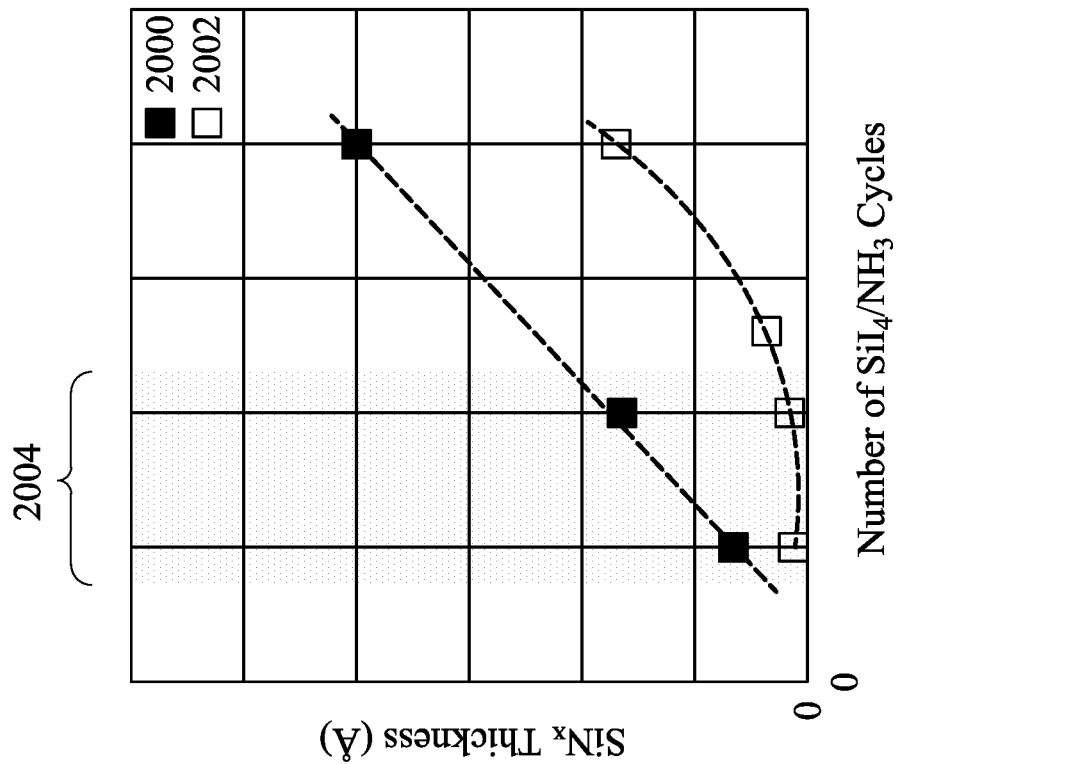
FIG. 13B is a diagram showing a thickness of a silicon nitride ($SiN_x$) film formed on the structure in FIG. 12 by PEALD using $SiI_4/NH_3$ gases versus a number of $SiI_4/NH_3$ gases cycles according to some embodiments.

FIG. 13B is a diagram showing a thickness of a silicon nitride ($SiN_x$) film formed on the structure in FIG. 12 by PEALD using $SiI_4/NH_3$ gases versus a number of $SiI_4/NH_3$ gases cycles according to some embodiments. In FIG. 13B, a region 2004 shows a process window of forming the first barrier layers 304 in FIG. 13A. A curve 2000 represents a top thickness and a bottom thickness of the silicon nitride film, and a curve 2002 represents a sidewall thickness of the silicon nitride film. In the curve 2002, the sidewall thickness of the silicon nitride film equals to zero under a small number of the $SiI_4/NH_3$ gases cycles while in the curve 2000, the top thickness and the bottom thickness of the silicon nitride film increases under a small number of the $SiI_4/NH_3$ gases cycles. As discussed previously, in cases where the first barrier layers 304 are formed using the plasma deposition (e.g., PEALD) process, the incubation cycles (the time for the silicon nitride to start forming) is controlled by the ion characteristics of the plasma during the plasma deposition process for forming the silicon nitride. It is relatively difficult for silicon nitride to incubate (stat forming) on the sidewalls of the source/drain recesses 226.

Reference is made to FIG. 14. An etch process, such as an anisotropic etch process is performed to remove the first passivation layer 302 on the sidewall of the source/drain recesses 226. In other words, the lateral passivation portion 302c is removed to expose the sidewalls of the source/drain recesses 226. The anisotropic etch process can be any acceptable etch process, such as reactive ion etching (RIE), neutral beam etching (NBE), or the like. After the etch process, the top passivation portion 302a, which is over the masks 218, and the bottom passivation portion 302b, which is located in the source/drain recesses 226, remain. As a result, a unit of the barrier structure is formed. A cycle of forming the unit of the barrier structure which includes forming the first passivation layer 302 (see FIG. 12), forming the first barrier layers 304, and etching the first passivation layer 302 is repeated until a desired thickness of the barrier structure is reached.

Figure 15:
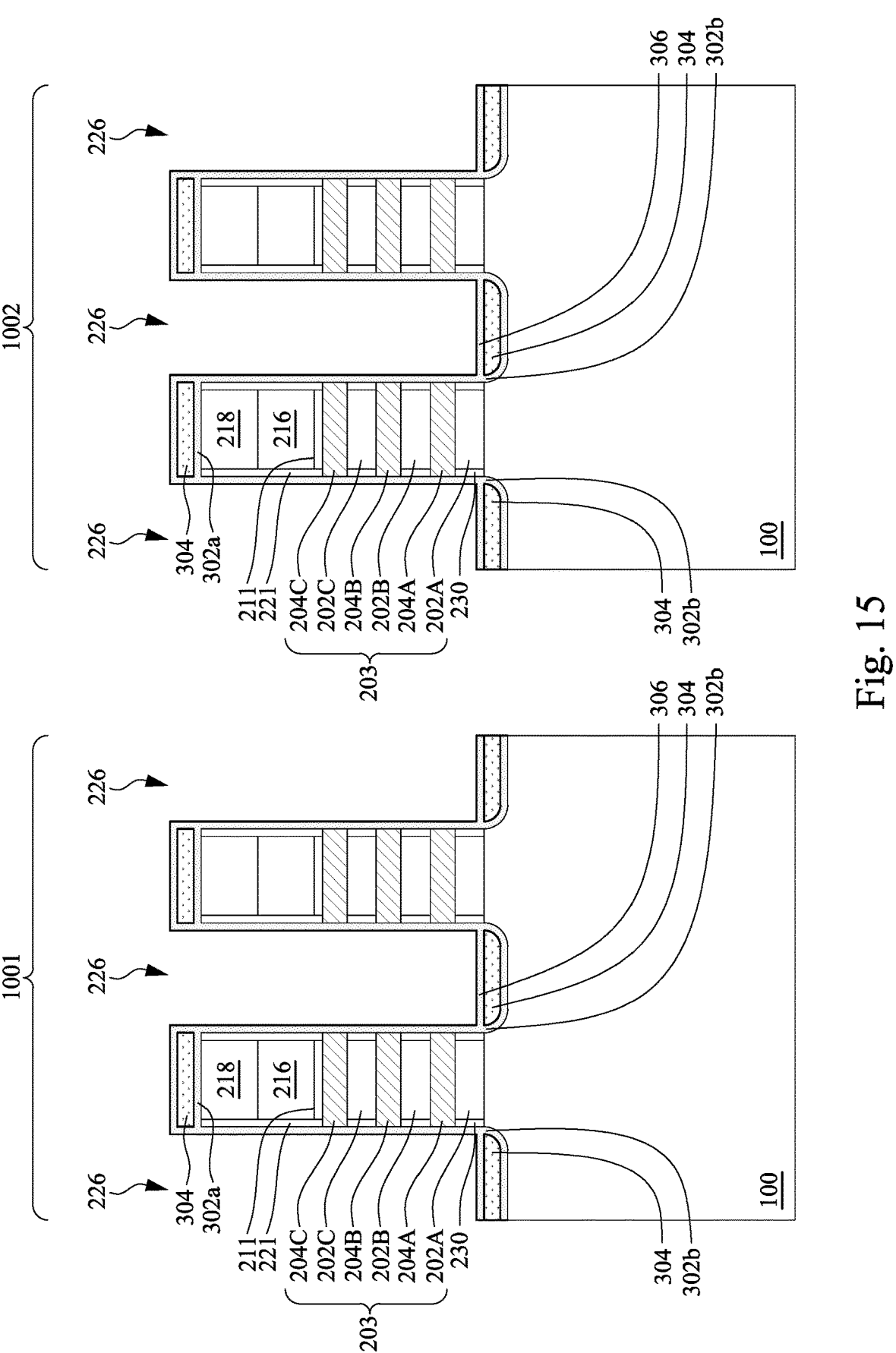

For example, in FIG. 15, a second passivation layer 306 is conformally formed over the structure illustrated in FIG. 14. The second passivation layer 306 is formed on the first barrier layers 304, and extends along the sidewalls of the nanostructures 203 (i.e., the sidewalls of the second semiconductor 204A-C), the first spacers 221, and the inner spacers 230 and the first barrier layers 304. The second passivation layer 306 may be similar to the first passivation layer 302 in terms of composition and formation method, which are discussed previously with respect to FIG. 12, and detailed description thereof is thus not repeated for the sake of brevity.

Figure 16:
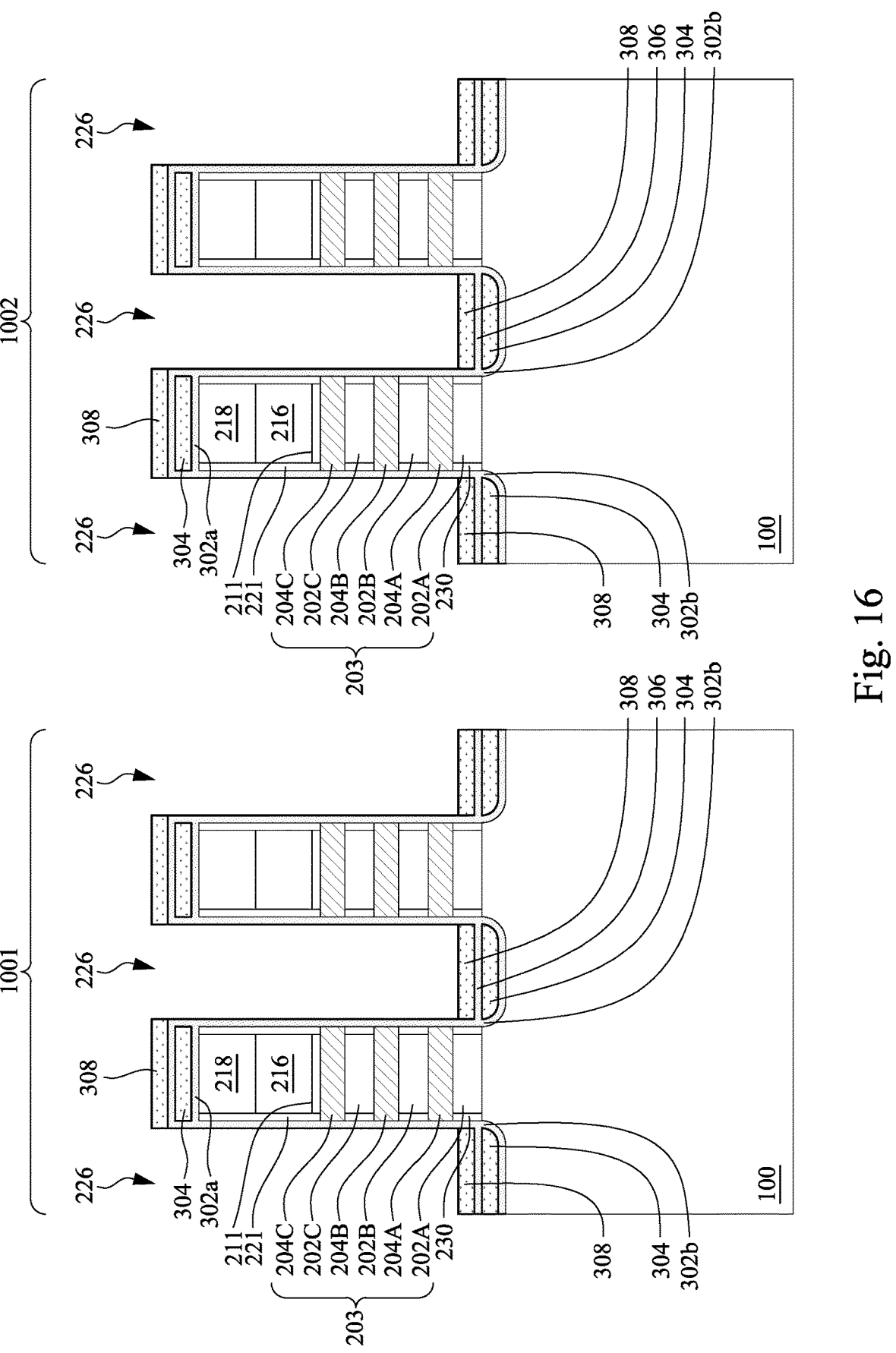

Reference is made to FIG. 16. Second barrier layers 308 are formed on the second passivation layer 306. For example, the second barrier layers 308 are selectively formed on parts of the second passivation layer 306 which are over the top surfaces of the masks 218 and directly over the bottom of the source/drain recesses 226 without forming on the second passivation layer 306 extending along the sidewalls of the source/drain recesses 226. In some embodiments, the second barrier layer 308 is formed using a plasma deposition process, such as a PEALD process. The second barrier layers 308 may be similar to the first barrier layers 304 in terms of composition and formation method, which are discussed previously with respect to FIG. 13A, and detailed description thereof is thus not repeated for the sake of brevity.

Figure 17:
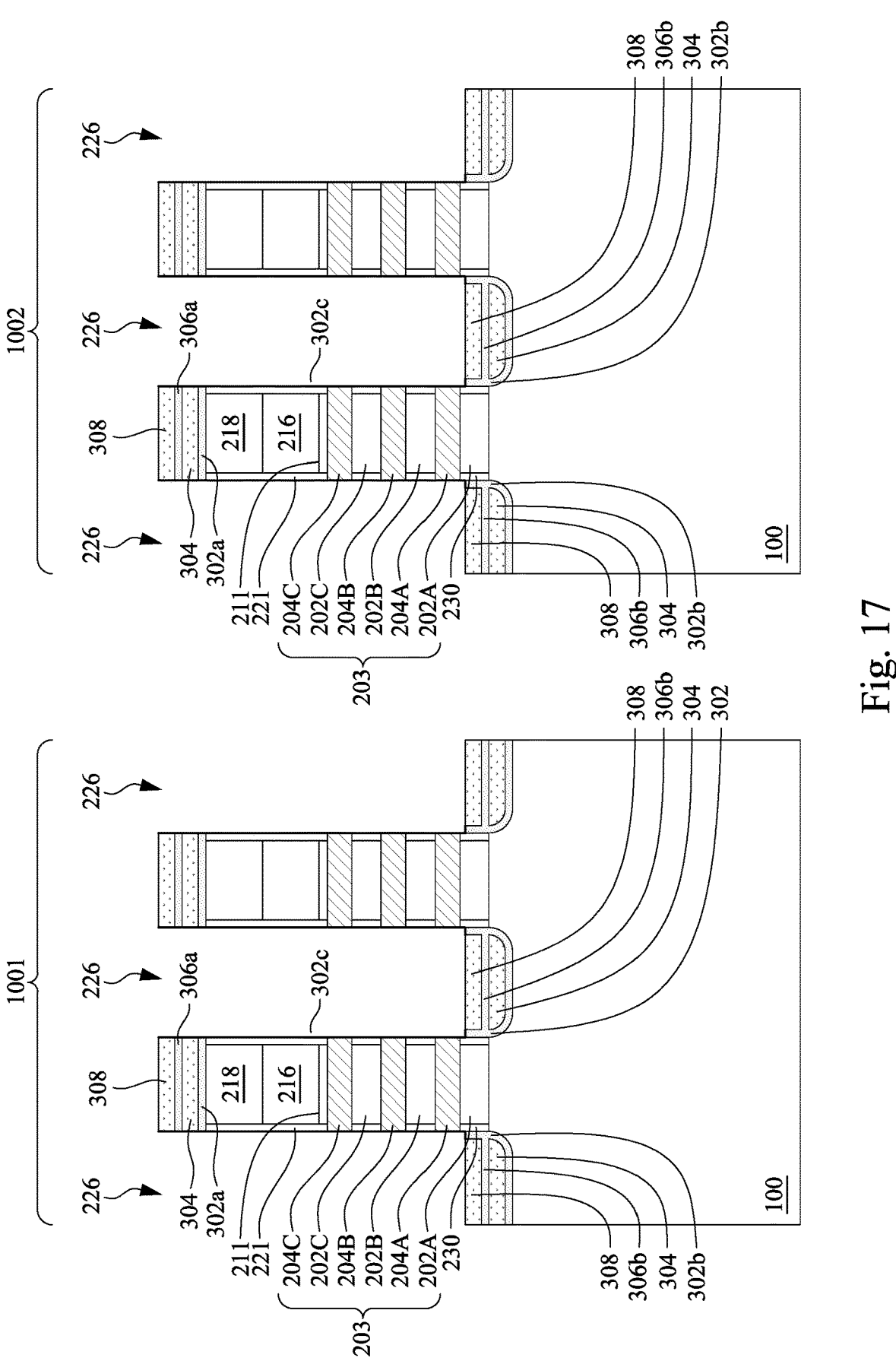

Reference is made to FIG. 17. An etch process, such as an anisotropic etch process is performed to remove the second passivation layer 306 on the sidewalls of the source/drain recesses 226, exposing the sidewalls of the source/drain recesses 226. The anisotropic etch process can be any acceptable etch process, such as reactive ion etching (RIE), neutral beam etching (NBE), or the like. After the etch process, a remainder of the second passivation layer 306 refers to as a top passivation portion 306a, which is over the masks 218, and a bottom passivation portion 306b, which is located in the source/drain recesses 226.

Figure 18:
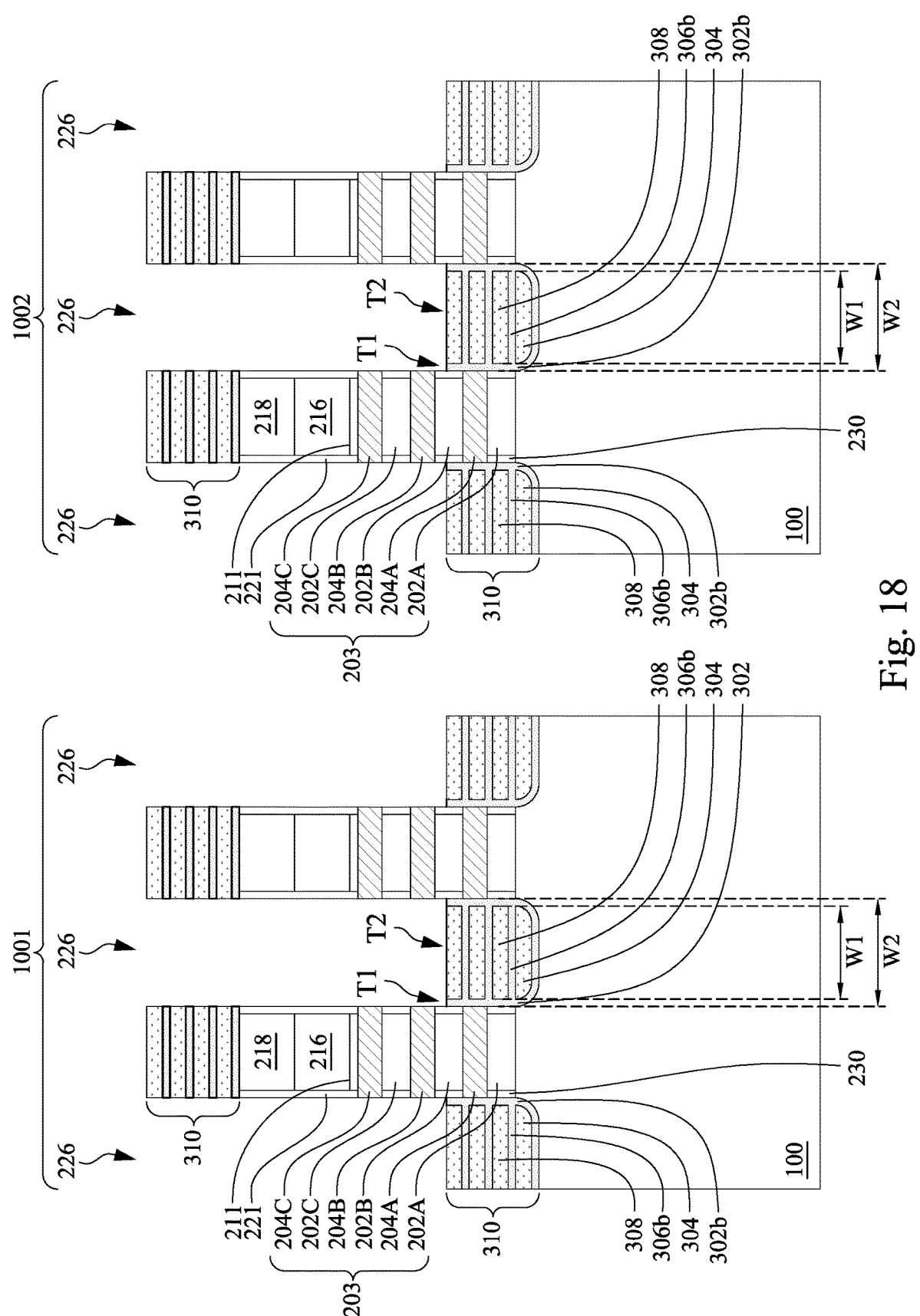

After a number of cycles of forming the units of the barrier structure, barrier structures 310 are formed, as shown in FIG. 18. The barrier structure 310 includes alternately stacked passivation layers and barrier layers. The bottom passivation portion 306b has a lateral width W2 greater than a lateral width W1 of the second barrier layer 308. The nanostructure 203 is separated from the barrier layers (e.g., the first barrier layer 304 and the second barrier layer 308) by the passivation layers (e.g., the bottom passivation portions 302b and the bottom passivation portions 306b). The barrier structure 310 has a top surface consisting of a top surface T1 of a topmost layer of the passivation layers and a top surface T2 of a topmost layer of the barrier layers. In FIG. 18, in the illustrated embodiments, each of the barrier structures 310 includes four passivation layers and four barrier layers. For example, the barrier structure 310 in the source/drain recesses 226 includes four passivation layers including the bottom passivation portions 302b, 306b and two non-labeled bottom passivation portions in the barrier structure 310, and four barrier layers including the first barrier layer 304, the second barrier layer 308 and two non-labeled barrier layers in the barrier structure 310. However, in other embodiments, the barrier structure 310 may include any number of passivation layers and barrier layers according to design specifications for the stacked devices.

Figure 19:
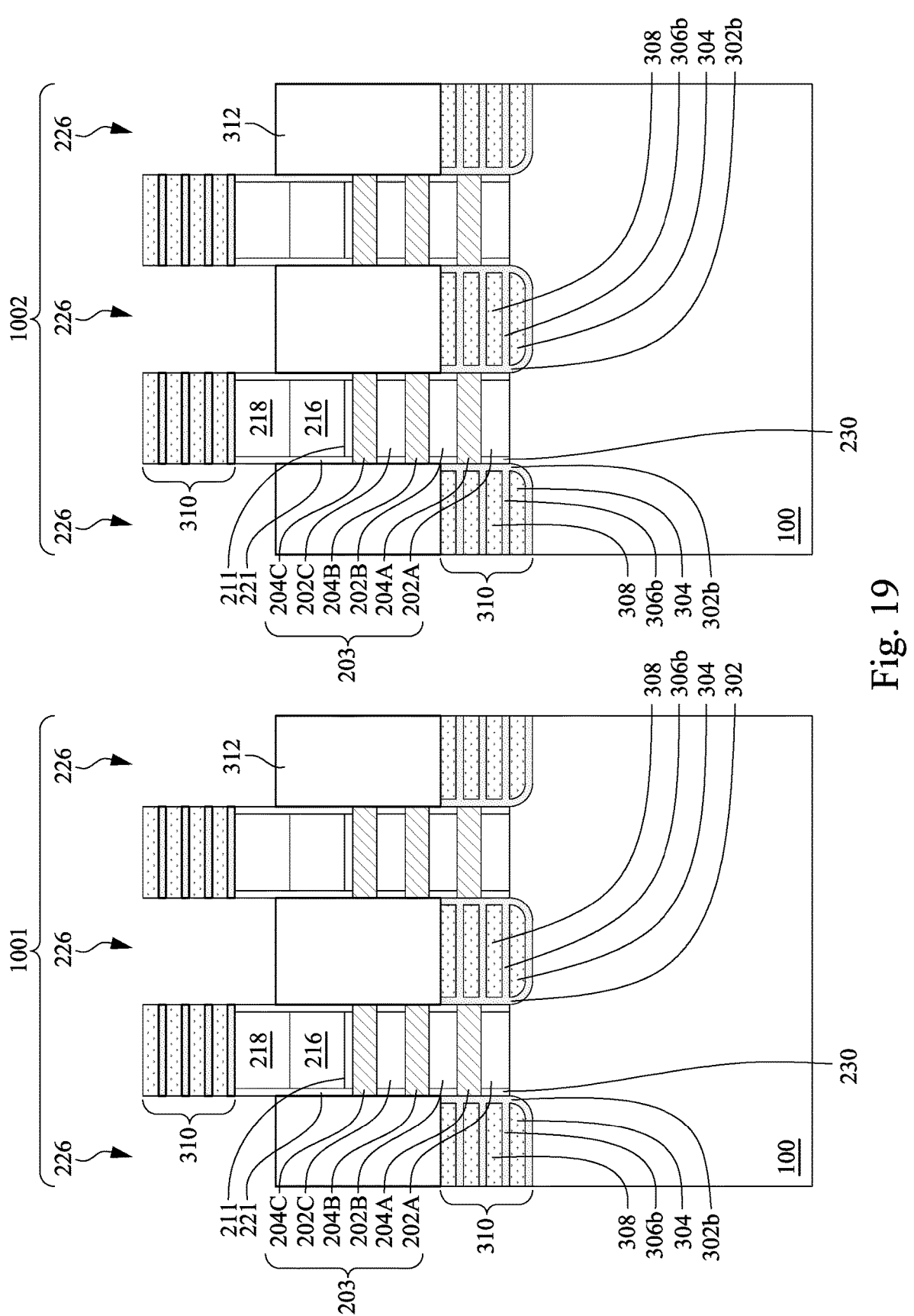

Reference is made to FIG. 19. A protection layer 312 is formed on the barrier structure 310 in the source/drain recesses 226. In some embodiments, the protection layer 312 may be a photoresist formed by using a spin-on technique and can be patterned using acceptable photolithography techniques. The protection layer 312 is configured to protect the underlying barrier structure 310 from being damaged during a subsequent process to remove the barrier structure 310 over the masks 218.

Figure 20:
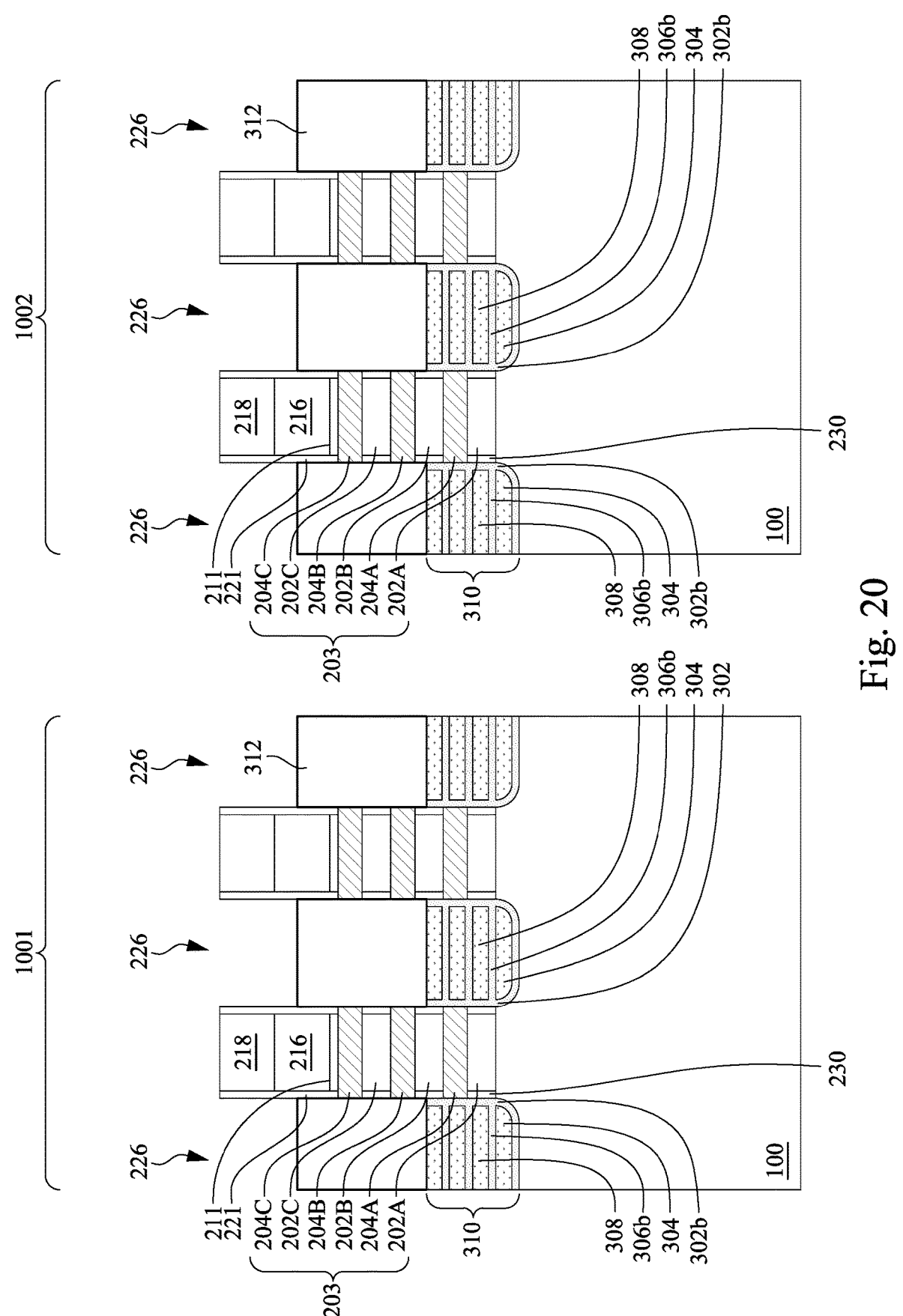

Reference is made to FIG. 20. The barrier structure 310 on the masks 218 is removed. In some embodiments, an etch back process is performed to remove the barrier structure 310 on the masks 218, exposing the top surfaces of the masks 218. The etch back process may be a reactive ion etch (RIE) processes and/or other suitable processes. In some other embodiments, the barrier structure 310 may be removed using a chemical mechanical polishing (CMP) process. The protection layer 312 may be partially removed during removing the barrier structure 310 such that a height of the protection layer 312 after removing the barrier structure 310 is reduced.

Figure 21A:
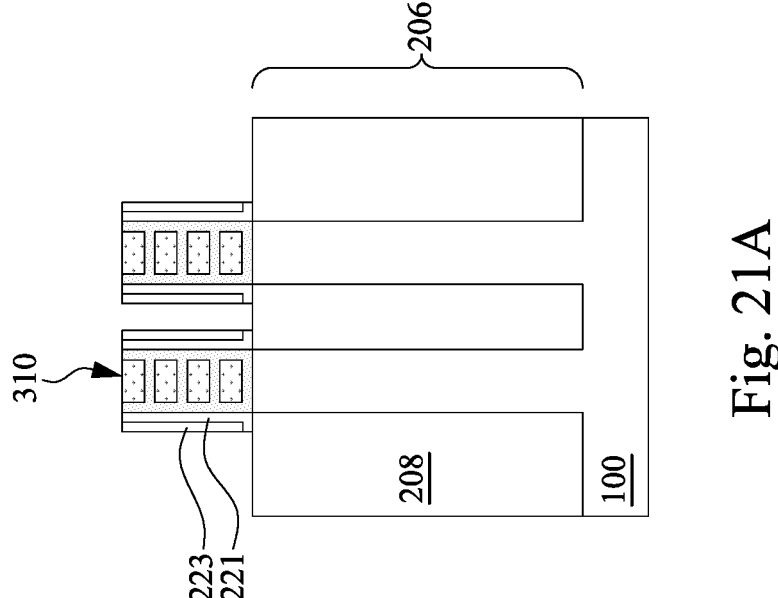
Figure 21B:
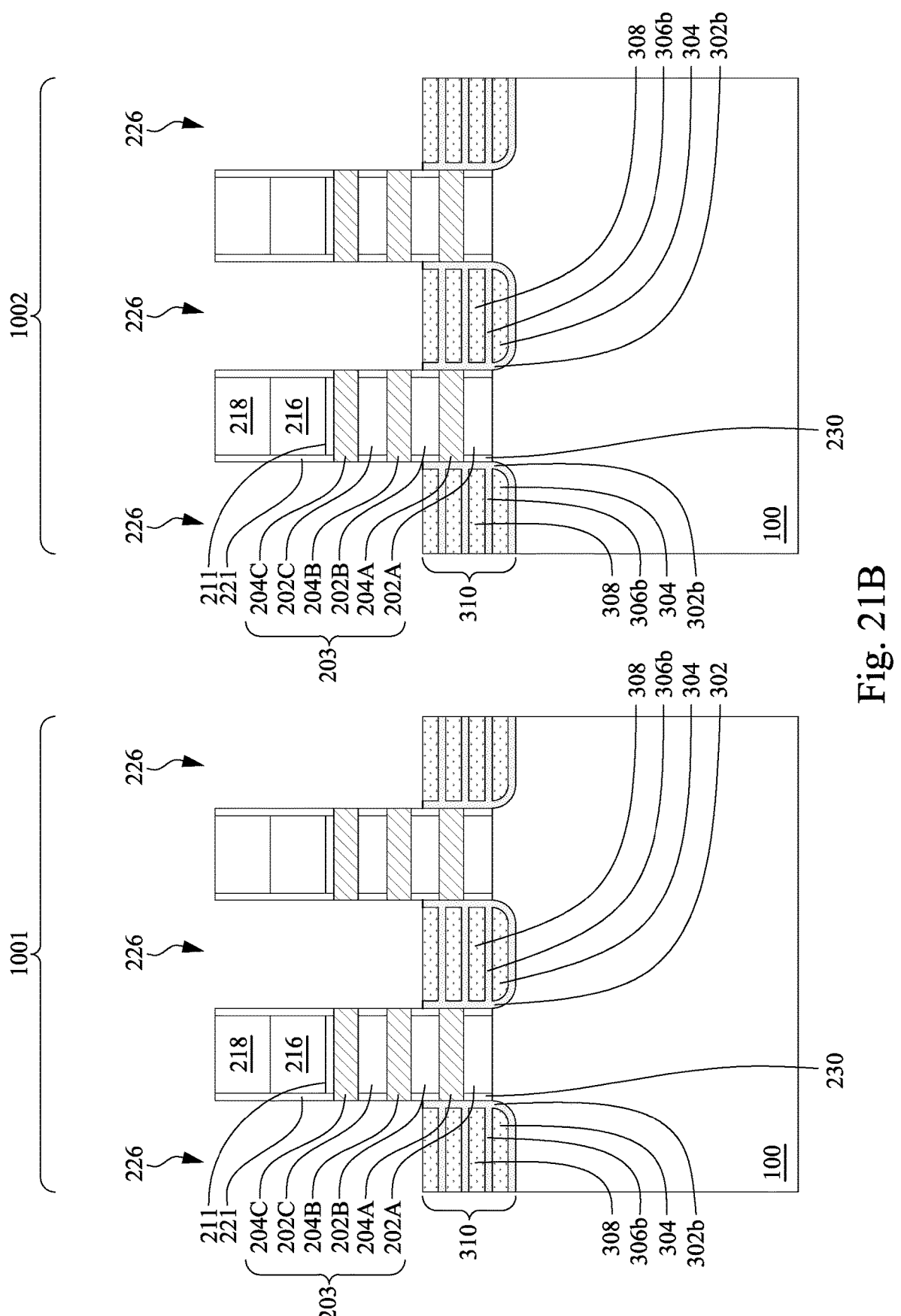

After removing the barrier structures 310 on the masks 218, the protection layer 312 is removed, such as by an acceptable ashing process. The resulting structure is shown in FIGS. 21A and 21B. The top of the barrier structures 310 in the source/drain recesses 226 are thus exposed to the source/drain recesses 226. The barrier structures 310 are on opposite sides of the nanostructures 203. The barrier structures 310 are in the source/drain recesses 226 such that each dummy gate 216 is disposed between respective neighboring pairs of the barrier structure 310.

Figure 22A:
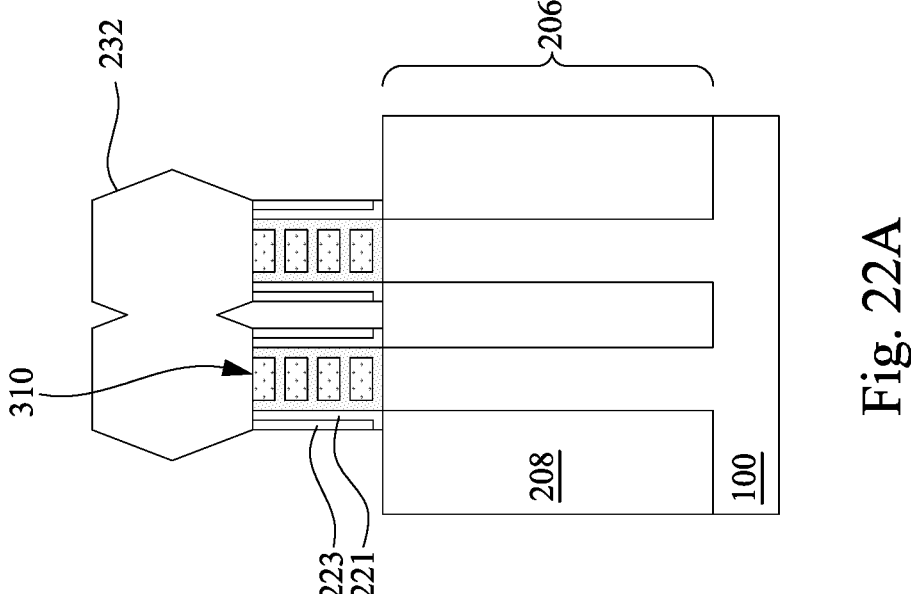
Figure 22B:
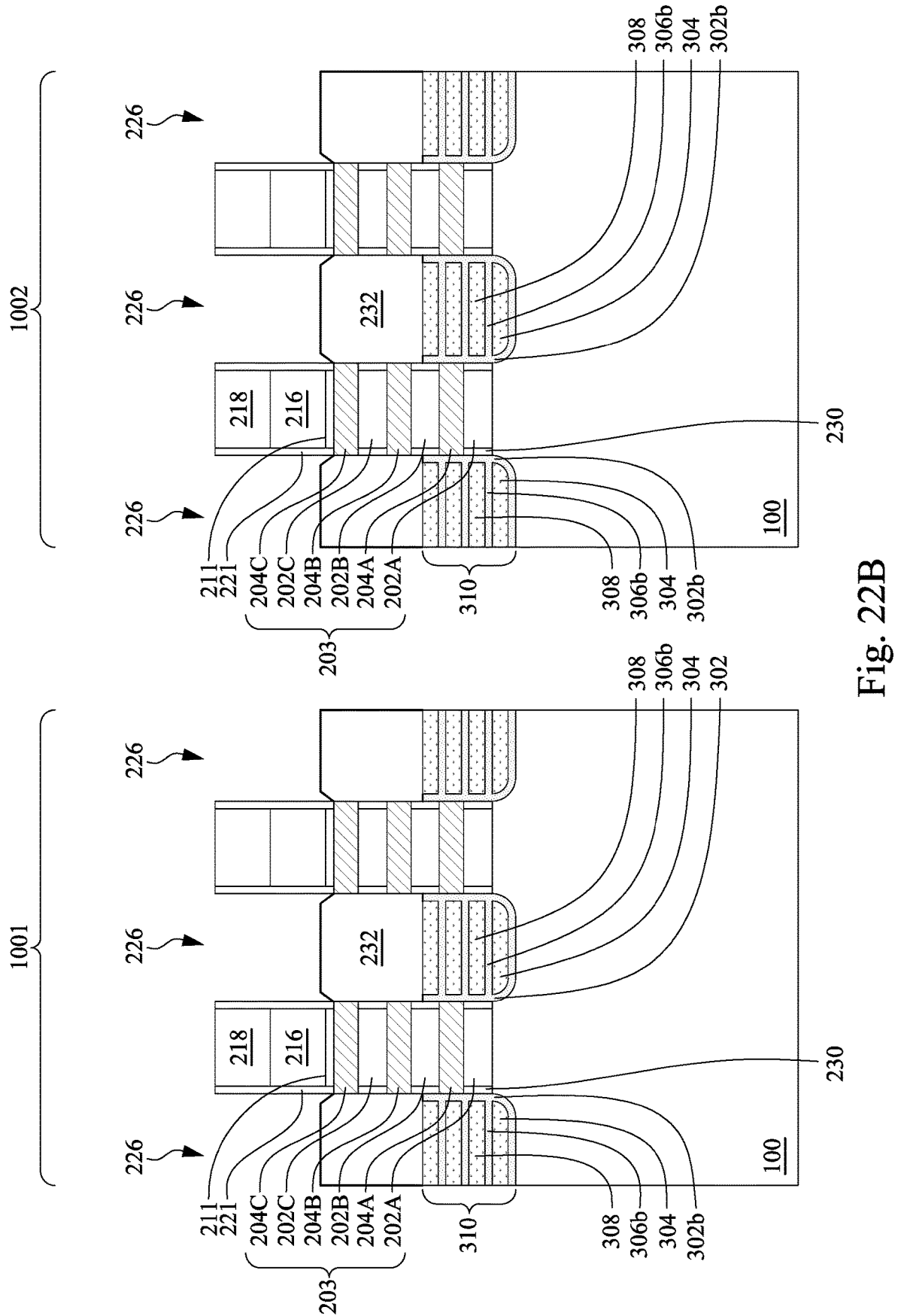

In FIGS. 22A-22B, epitaxial source/drain regions 232 are formed over the barrier structures 310 in the source/drain recesses 226. The epitaxial source/drain regions 232 vertically overlap the barrier structure 310. The epitaxial source/drain regions 232 are separated from the substrate 100 by the barrier structures 310. As discussed previously, by disposing the barrier structure 310, the source/drain regions 232 are prevented from being in direct contact with the substrate 100. The barrier structure 310 provides full isolation of the epitaxial source/drain regions 232 from the substrate 100 or the fin, thereby reducing a mesa leakage between adjacent source/drain regions 232 and a parasitic capacitance at the bottommost one of subsequently formed channels (such as the second nanostructures 204). In some embodiments, the epitaxial source/drain regions 232 may exert stress on the second nanostructures 204, thereby improving device performance. As illustrated in FIG. 22B, the epitaxial source/drain regions 232 are formed in the source/drain recesses 226 such that each dummy gate 216 is disposed between respective neighboring pairs of the epitaxial source/drain regions 232. In some embodiments, the first spacers 221 are used to separate the epitaxial source/drain regions 232 from the dummy gates 216 and the inner spacers 230 are used to separate the epitaxial source/drain regions 232 from the first nanostructures 202 by an appropriate lateral distance so that the epitaxial source/drain regions 232 do not short out with subsequently formed gates of the resulting GAA-FETs.

In some embodiments, the epitaxial source/drain regions 232 may include any acceptable material appropriate for n-type GAA-FETs. For example, if the second nanostructures 204 are silicon, the epitaxial source/drain regions 232 may include materials exerting a tensile strain on the second nanostructures 204, such as silicon carbide, phosphorous doped silicon carbide, silicon phosphide, or the like. In some embodiments, the epitaxial source/drain regions 232 may include any acceptable material appropriate for p-type GAA-FETs. For example, if the second nanostructures 204 are silicon, the epitaxial source/drain regions 232 may comprise materials exerting a compressive strain on the second nanostructures 204, such as silicon germanium, boron doped silicon germanium, germanium, germanium tin, or the like. The epitaxial source/drain regions 232 may have surfaces raised from respective upper surfaces of the nanostructures 203 and may have facets.

The epitaxial source/drain regions 232 may be implanted with dopants to form source/drain regions, followed by an anneal. The n-type and/or p-type impurities for source/drain regions may be any of the impurities previously discussed.

In some embodiments, the epitaxial source/drain regions 232 may be in situ doped during growth.

As a result of the epitaxy processes used to form the epitaxial source/drain regions 232, upper surfaces of the epitaxial source/drain regions 232 have facets which expand laterally outward beyond sidewalls of the nanostructures 203. In some embodiments, these facets cause adjacent epitaxial source/drain regions 232 to merge as illustrated by FIG. 22A. In some other embodiments, adjacent epitaxial source/drain regions 232 remain separated after the epitaxy process is completed. In the embodiments illustrated in FIG. 22A, the first spacers 221 may be formed to a top surface of the STI regions 208 thereby blocking the lateral epitaxial growth. In some other embodiments, the first spacers 221 may cover portions of the sidewalls of the nanostructures 203 further blocking the epitaxial growth. In some other embodiments, the spacer etch used to form the first spacers 221 may be adjusted to remove the spacer material to allow the epitaxially grown region to extend to the surface of the STI region 58.

Figure 23A:
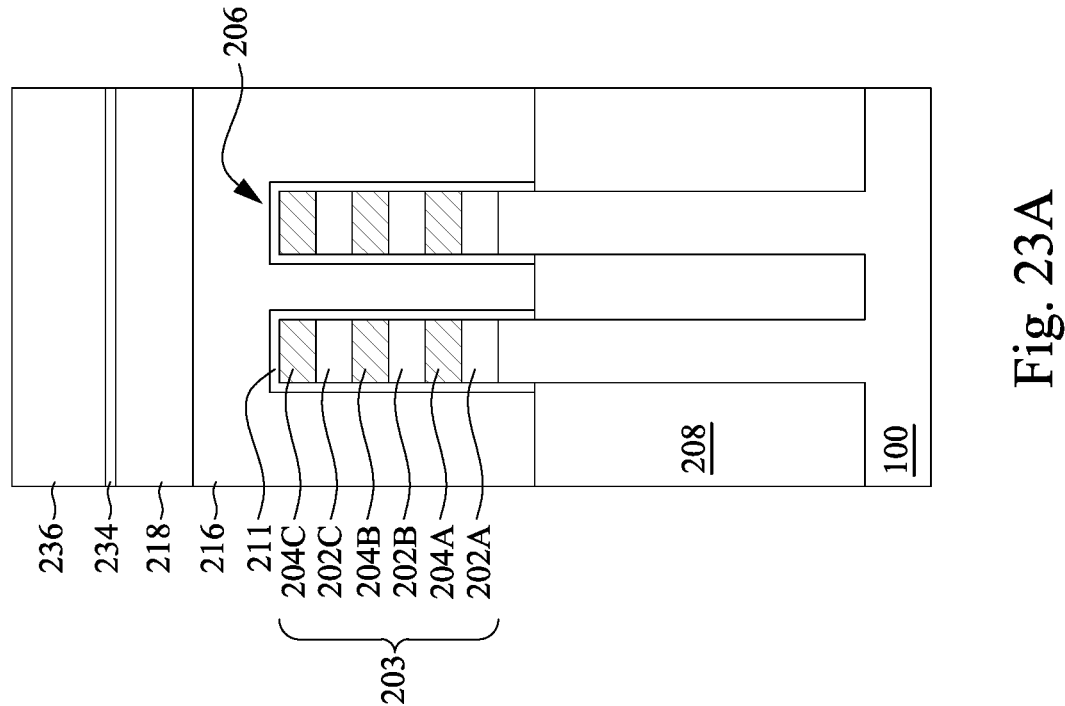
Figure 23B:
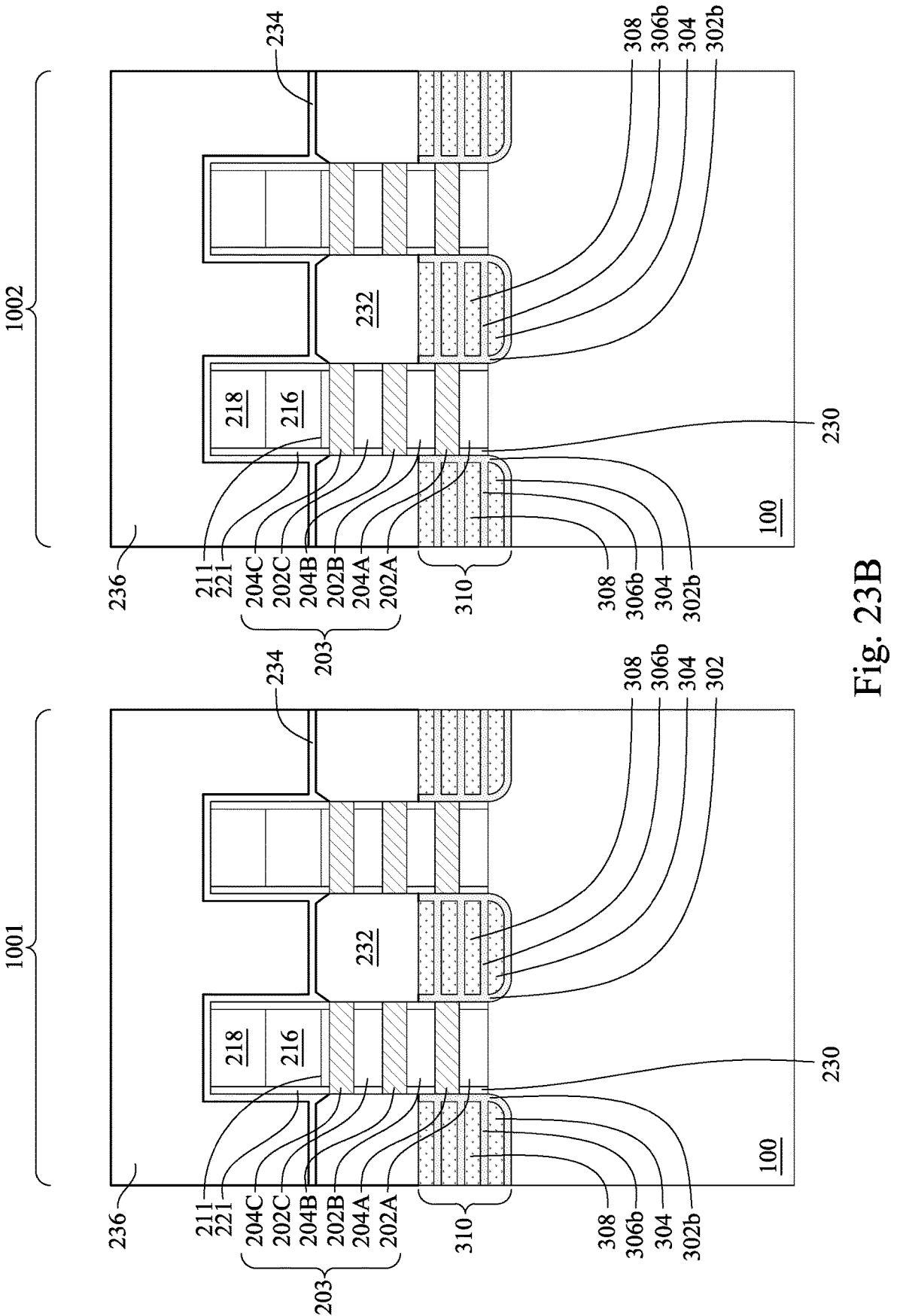
Figure 23C:
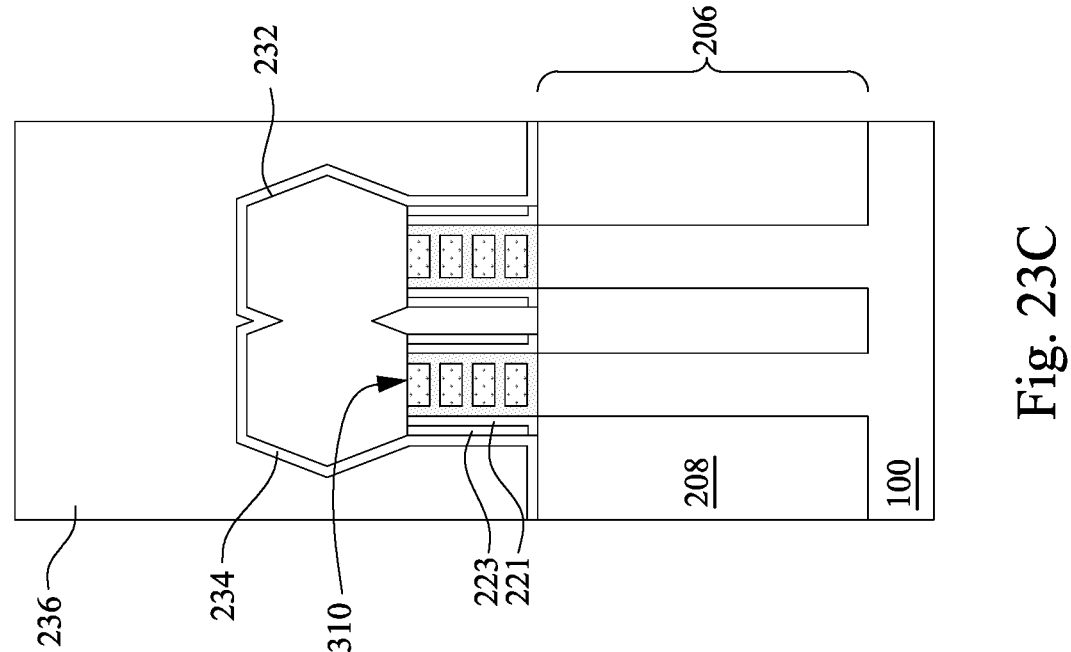

In FIGS. 23A-23C, an interlayer dielectric (ILD) layer 236 is deposited over the structure illustrated in FIGS. 22A-22B. The ILD layer 236 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 234 is disposed between the ILD layer 236 and the epitaxial source/drain regions 232, the masks 218, and the first spacers 221. The CESL 234 may comprise a dielectric material, such as, silicon nitride, silicon oxide, silicon oxynitride, or the like, having a different etch rate than the material of the overlying ILD layer 236.

Figure 24A:
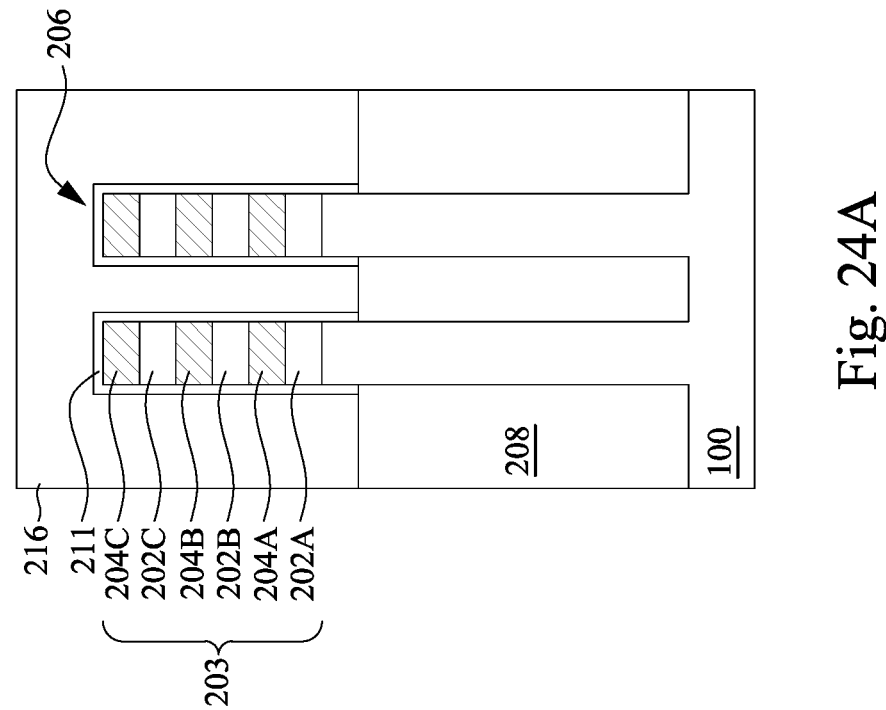
Figure 24B:
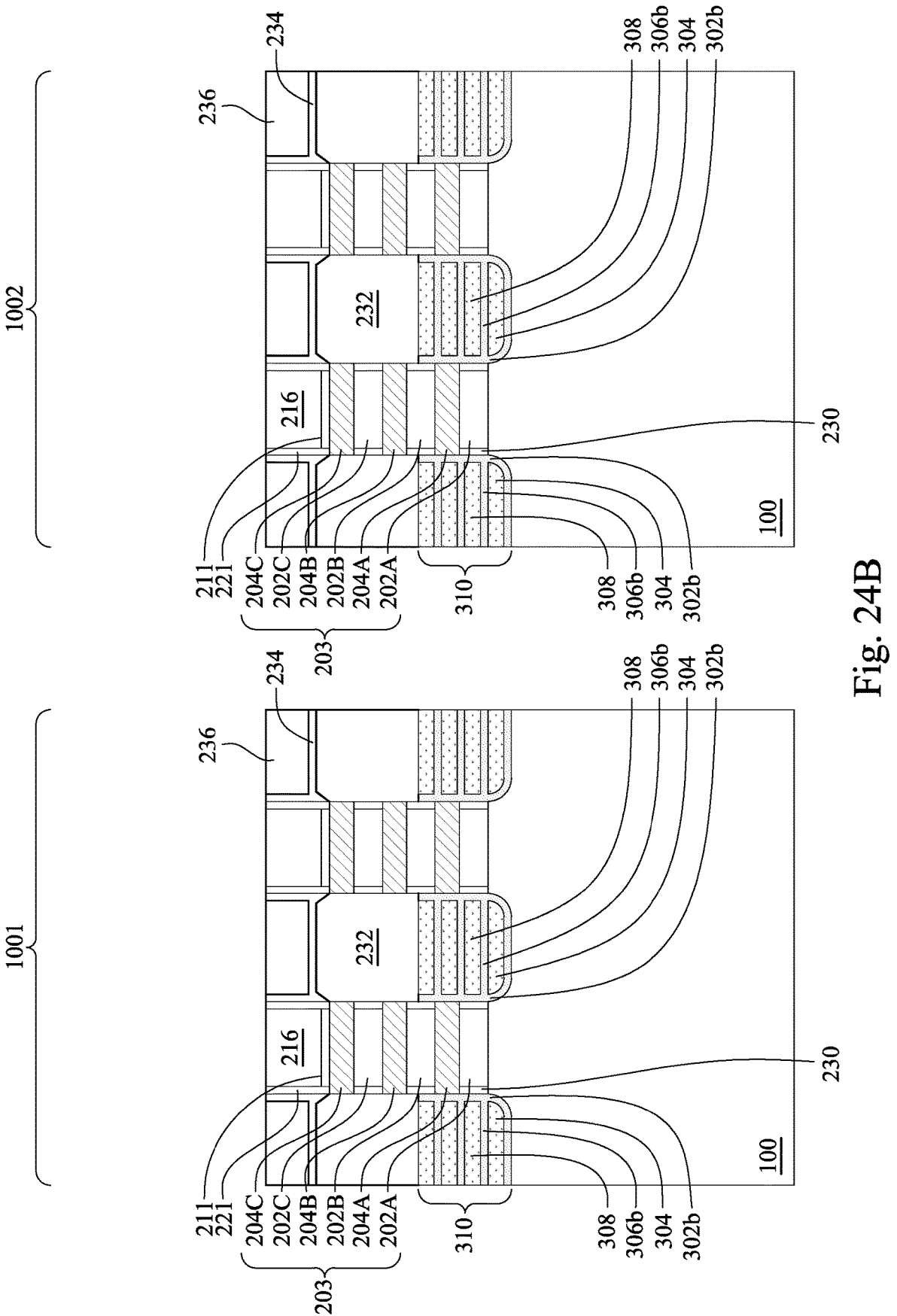

In FIGS. 24A-24B, a planarization process, such as a CMP, may be performed to level the top surface of the ILD layer 236 with the top surfaces of the dummy gates 216 or the masks 218. The planarization process may also remove the masks 218 on the dummy gates 216, and portions of the first spacers 221 along sidewalls of the masks 218. After the planarization process, top surfaces of the dummy gates 216, the first spacers 221, and the ILD layer 236 are level within process variations. Accordingly, the top surfaces of the dummy gates 216 are exposed through the ILD layer 236. In some embodiments, the masks 218 may remain, in which case the planarization process levels the top surface of the ILD layer 236 with top surface of the masks 218 and the first spacers 221.

Figure 25A:
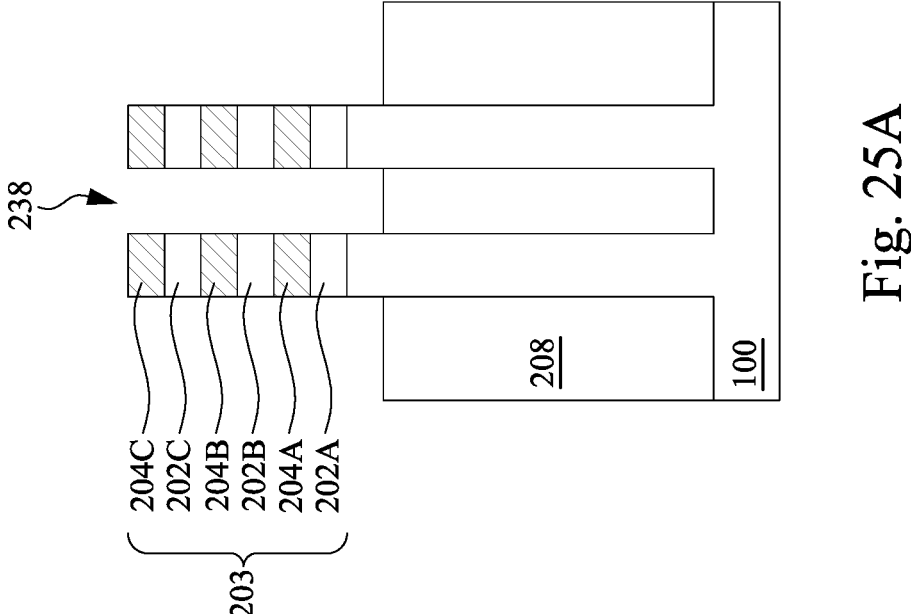
Figure 25B:
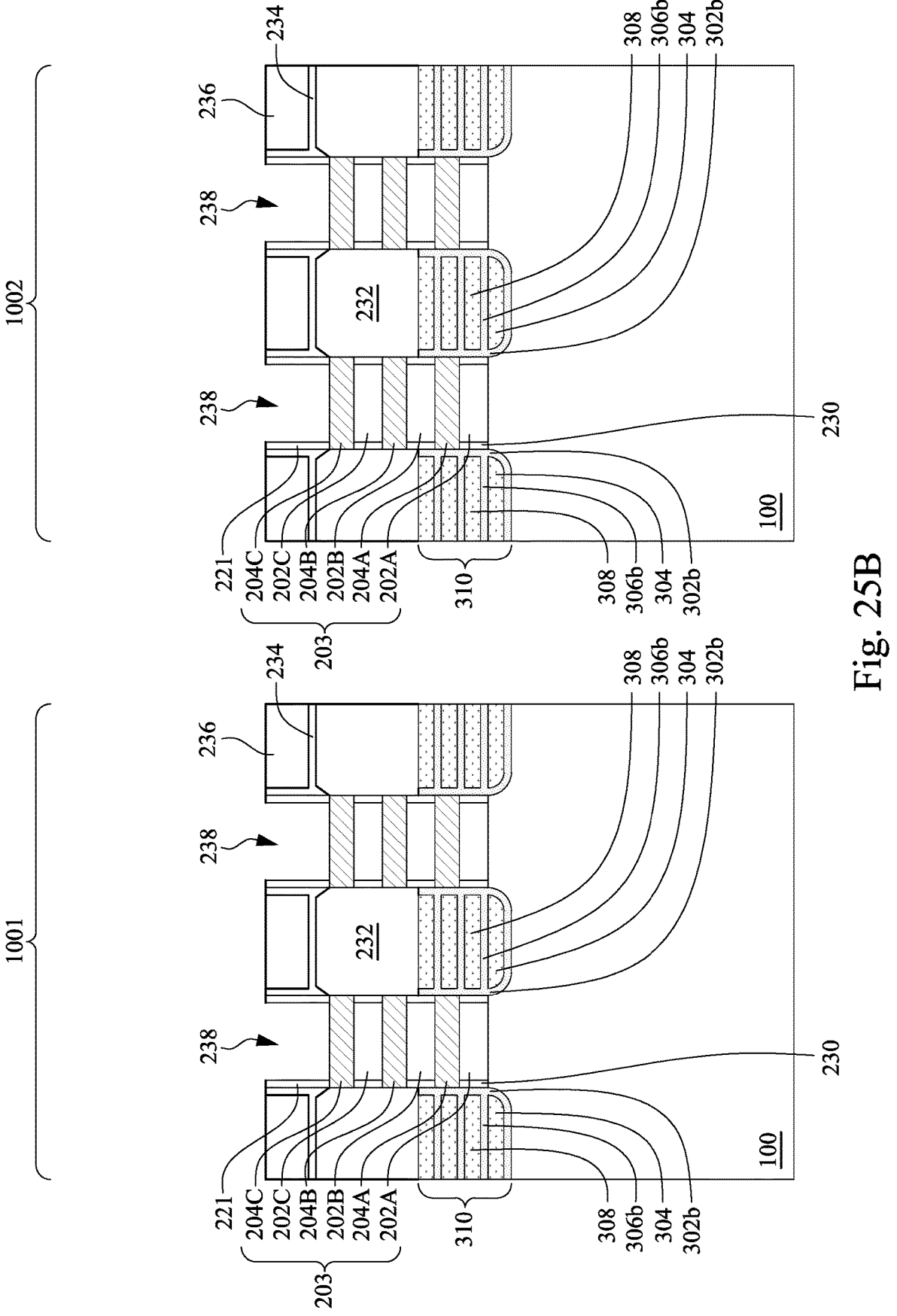

In FIGS. 25A and 25B, the dummy gates 216, and the masks 218 if present, are removed in one or more etching steps, so that gate trenches 238 are formed between corresponding first spacers 221. In some embodiments, portions of the dummy gate dielectrics 211 in the gate trenches 238 are also be removed. In some embodiments, the dummy gates 216 and the dummy gate dielectrics 211 are removed by an anisotropic dry etch process. For example, the etching process may include a dry etch process using reaction gas(es) that selectively etch the dummy gates 216 at a faster rate than the ILD layer 236 or the first spacers 221. Each gate trench 238 exposes and/or overlies portions of nanostructures 204, which act as channel regions in subsequently completed GAA-FETs. The nanostructures 204 which act as the channel regions are disposed between neighboring pairs of the epitaxial source/drain regions 232. During the removal, the dummy gate dielectrics 211 may be used as etch stop layers when the dummy gates 216 are etched. The dummy gate dielectrics 211 may then be removed after the removal of the dummy gates 216.

Figure 26A:
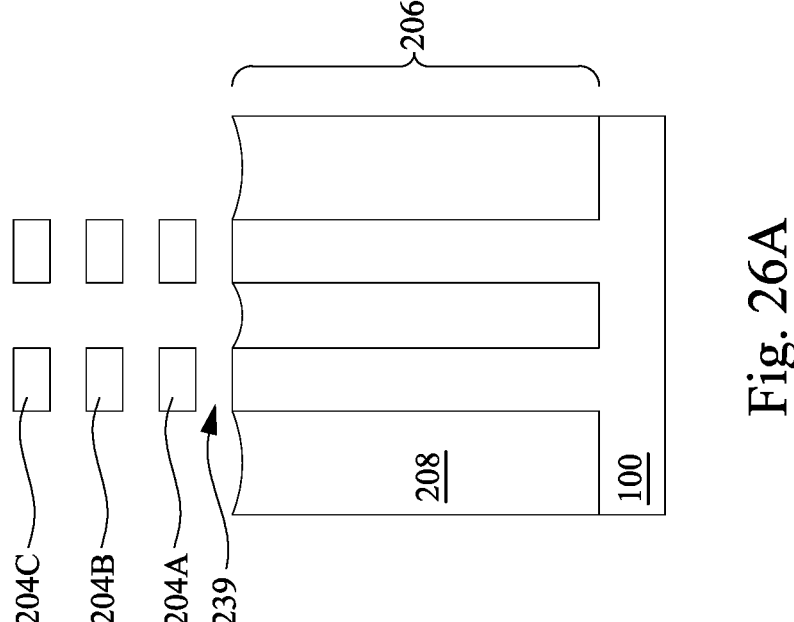
Figure 26B:
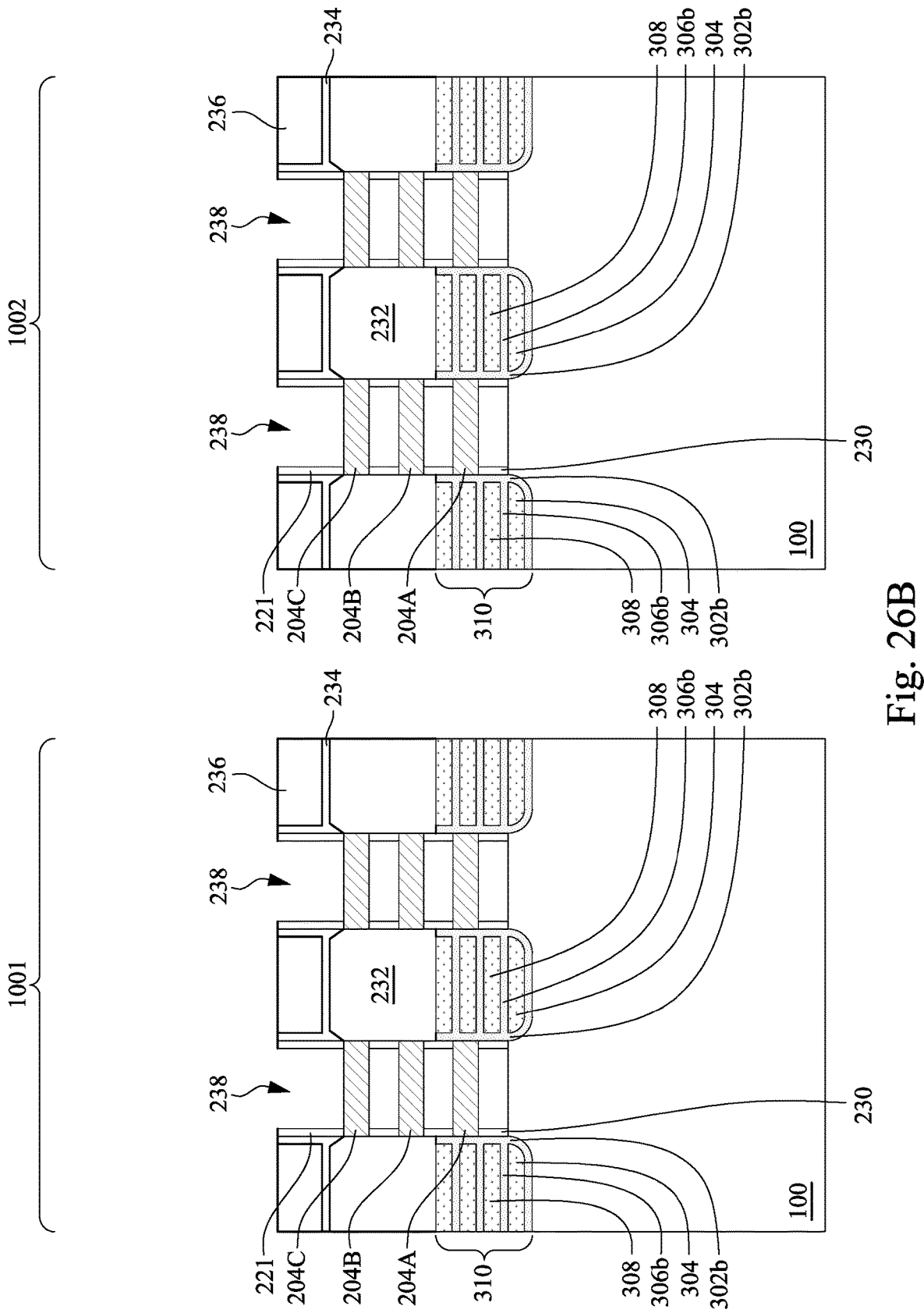

The first nanostructures 202 in the gate trenches are removed by an isotropic etching process such as wet etching or the like using etchants which are selective to the materials of the first nanostructures 202, as shown in FIGS. 26A and 26B. Stated differently, the first nanostructures 202 are removed by using a selective etching process that etches the first nanostructures 202 at a faster etch rate than it etches the second nanostructures 204, thus forming spaces between the second nanostructures 204 (also referred to as sheet-sheet spaces if the nanostructures 204 are nanosheets). This step can be referred to as a channel release process. At this interim processing step, the spaces between second nanostructures 204 may be filled with ambient environment conditions (e.g., air, nitrogen, etc). In some embodiments, the second nanostructures 204 can be referred to as nanosheets, nanowires, nanoslabs, nanorings having nanoscale size (e.g., a few nanometers), depending on their geometry. For example, in some embodiments the second nanostructures 204 may be trimmed to have a substantial rounded shape (i.e., cylindrical) due to the selective etching process for completely removing the first nanostructures 202. In that case, the resultant second nanostructures 204 can be called nanowires.

In embodiments in which the first nanostructures 202 include, e.g., SiGe, and the second nanostructures 204 include, e.g., Si or SiC, tetramethylammonium hydroxide (TMAH), ammonium hydroxide ($NH_4OH$) or the like may be used to remove the first nanostructures 202. In some embodiments, both the channel release step and the previous step of laterally recessing first nanostructures 202 (i.e., the step as illustrated in FIGS. 10A-10B) use a selective etching process that etches first nanostructures 202 (e.g., SiGe) at a faster etch rate than etching second nanostructures 204 (e.g., Si), and therefore these two steps may use the same etchant chemistry in some embodiments. In this case, the etching time/duration of channel release step is longer than the etching time/duration of the previous step of laterally recessing first nanostructures 202, so as to completely remove the sacrificial nanostructures 202.

Figure 27A:
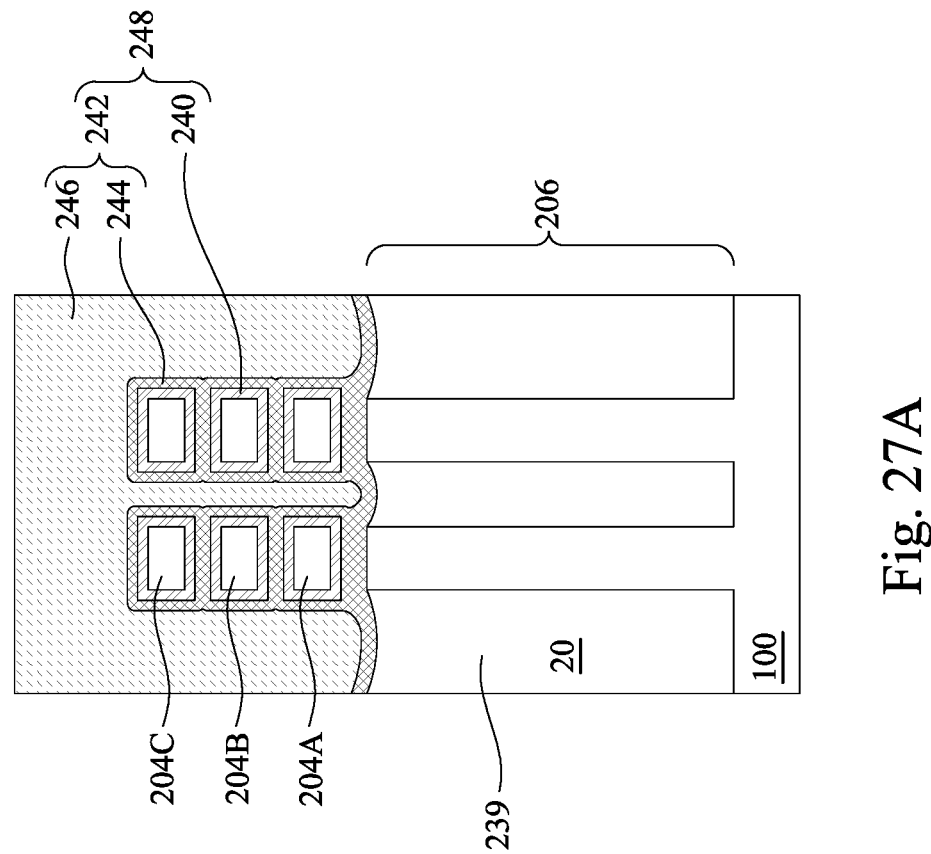
Figure 27B:
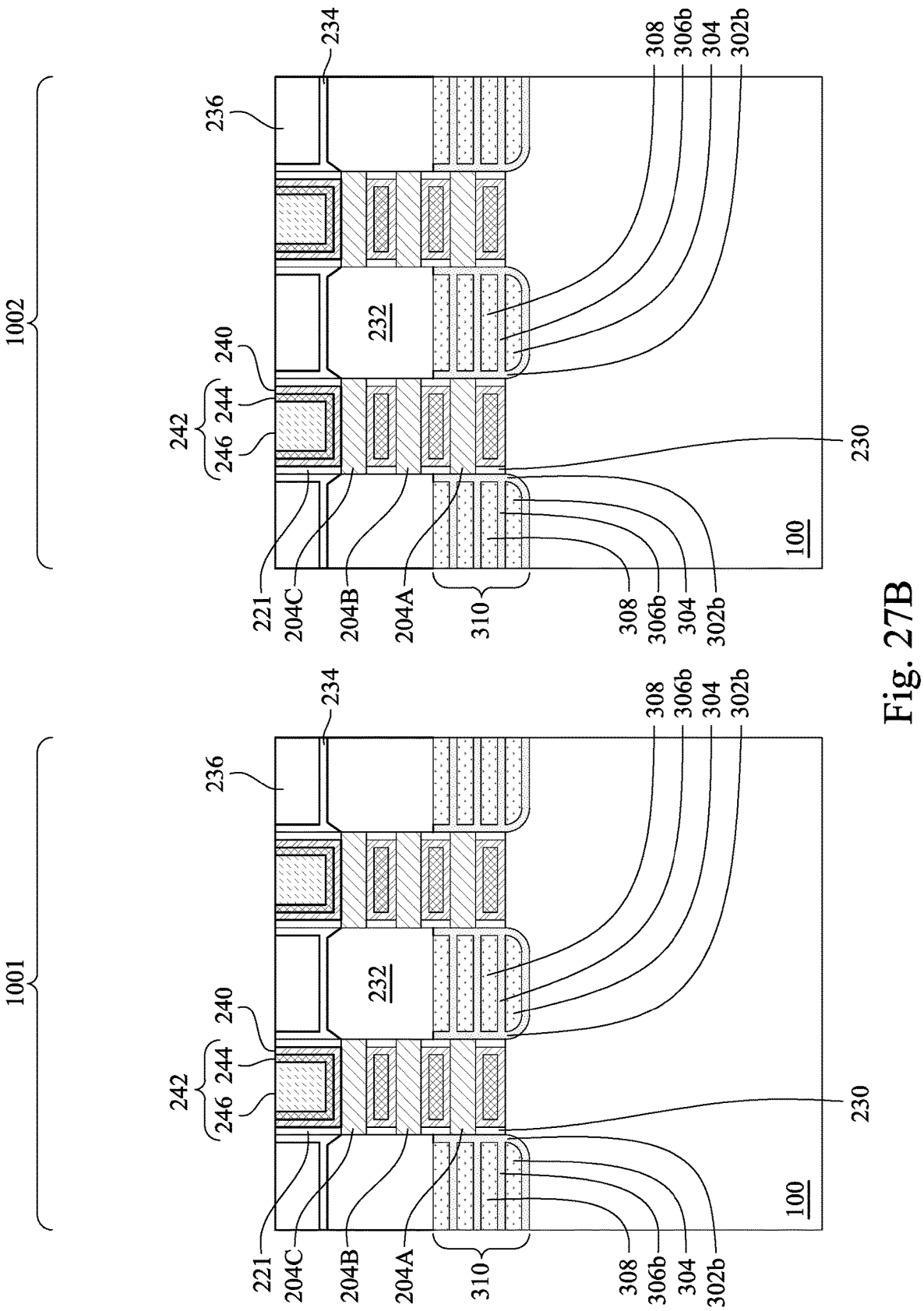

Next, in FIGS. 27A and 27B, high-k/metal gate structures are formed. For example, a gate dielectric layer 240 is formed (e.g., conformally) in the gate trenches 238 and in the gaps 239. The gate dielectric layer 240 wraps around the second nanostructures 204, lines sidewalls of the inner spacers 230 and sidewalls of the first spacers 221, and extends along the upper surface of the fin structures 206. In accordance with some embodiments, the gate dielectric layer 240 includes silicon oxide, silicon nitride, or multilayers thereof. In some embodiments, the gate dielectric layer 240 includes a high-k dielectric material, and in these embodiments, the gate dielectric layer 240 may have a dielectric constant greater than about 7.0, and may include a metal oxide or a silicate of Hf, Al, Zr, La, Mg, Ba, Ti, or Pb, or combinations thereof. The formation methods of the gate dielectric layer 240 may include Molecular-Beam Deposition (MBD), ALD, PECVD, and the like.

In an alternative embodiment, an interfacial layer (not shown) is deposited between the gate dielectric layer 240 and the second nanostructures 204 and is formed of silicon oxide or silicon oxynitride grown by a thermal oxidation process. For example, the interfacial layer can be grown by a rapid thermal oxidation (RTO) process or by an annealing process using oxygen.

Next, a gate electrode material (e.g., an electrically conductive material) is formed in the gate trenches 238 and in the gaps 239 to form the gate electrodes 242. The gate electrodes 242 fill the remaining portions of the gate trenches 238 and in the gaps 239. For example, the gate electrodes 242 include one or more work function layers 244 and a fill metal layer 246. A CMP is then performed on the fill metal layer 246, the one or more work function layers 244 and the gate dielectric layer 240 until the ILD layer 236 is exposed, resulting in the fill metal layer 246, the one or more work function layers 244 and the gate dielectric layer 240, the CESL 234, and the ILD layer 236 having substantially level top surfaces. The gate electrodes 242 and the gate dielectric layer 240 are collectively referred to as metal gate structures 248.

The one or more work function layers 244 may be deposited to surround each of the second nanostructures 204. A portion of the one or more work function layers 244 is formed vertically between adjacent second nanostructures 204 and fills the gaps 239 between adjacent second nanostructures 204.

The one or more work function layers can provide a suitable work function for the high-k/metal gate structures. For an n-type GAA FET, the one or more work function layers 244 may include one or more n-type work function metals (N-metal). The n-type work function metals may exemplarily include, but are not limited to, titanium aluminide (TiAl), titanium aluminium nitride (TiAlN), carbonitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the one or more work function layers 244 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal layer 246 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 28:
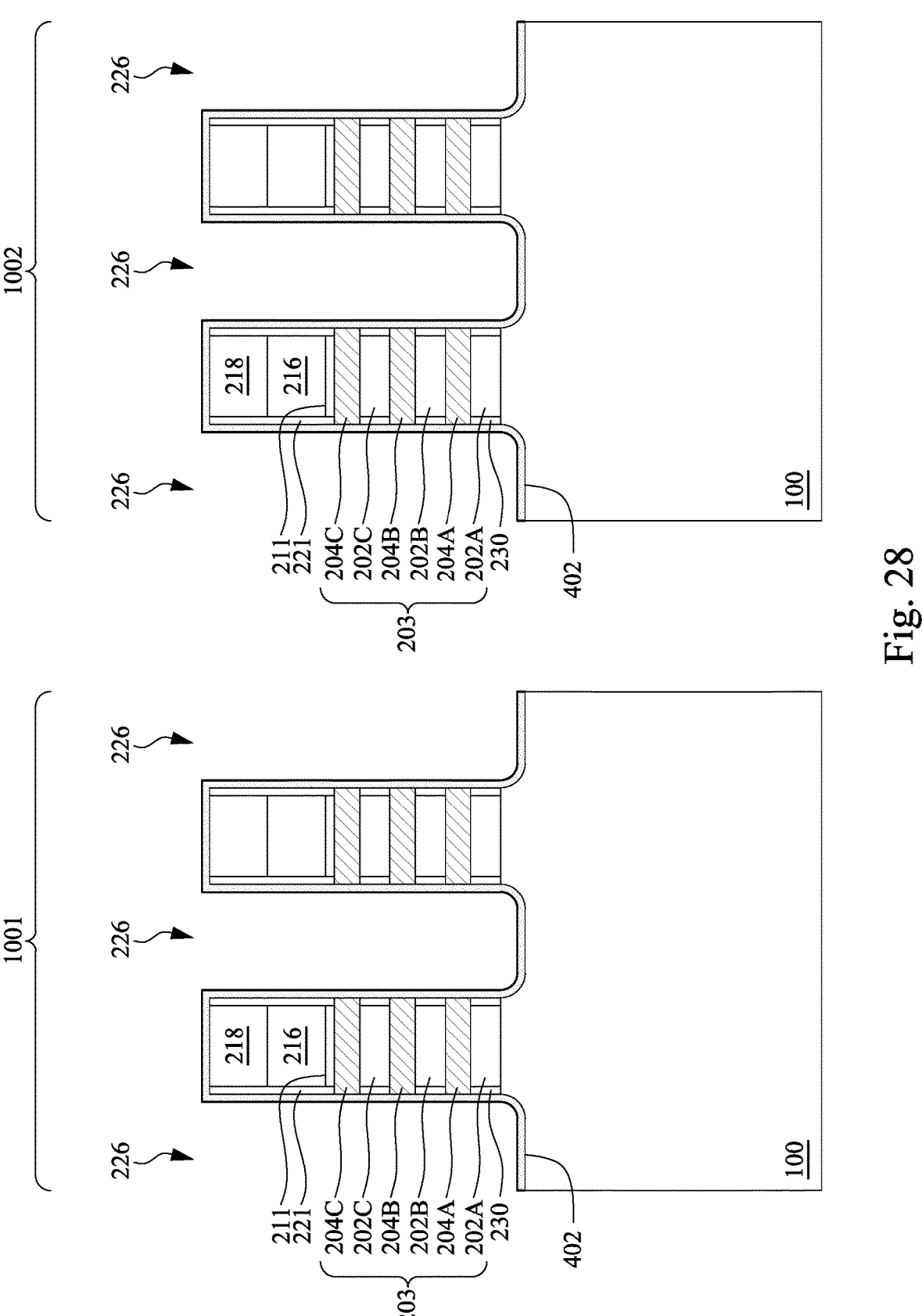
FIGS. 28 through 32 are cross-sectional views at intermediate fabrication stages, illustrating reference cross-section B-B' illustrated in FIG. 1 that extends through a fin along a longitudinal axis of the fin in accordance some other embodiments.

FIGS. 28 through 32 are cross-sectional views at intermediate fabrication stages, illustrating reference cross-section B-B' illustrated in FIG. 1 that extends through a fin along a longitudinal axis of the fin in accordance some other embodiments. FIG. 28 illustrates the resulting structure after a passivation layer 402 is conformally formed on the top surface of the substrate 100, the top surfaces of the masks 218 and extends along the sidewalls of the nanostructures 203 (i.e., the sidewalls of the second semiconductor 204A-C), and the sidewalls of the first spacers 221 and the inner spacers 230, as discussed previously with regard to FIG. 12. The passivation layer 402 includes silicon oxide (e.g., silicon dioxide), silicon carbide, or silicon nitride and is deposited using atomic layer deposition, chemical vapor deposition, or the like. The passivation layer 402 can passivate the sidewalls of the second nanostructures 204 and thus prevent the second nanostructures (act as channel regions for the GAA-FETs) from being damaged during a subsequent deposition method for forming a barrier layer (such as the barrier layer 404, discussed below with respect to FIG. 29), preventing degradation of device performance. The passivation layer 402 can also act as an etch stop layer in a subsequent dry etch process to remove the barrier layer from the sidewall of the source/drain recesses 226 and the top of the masks 218.

Figure 29:
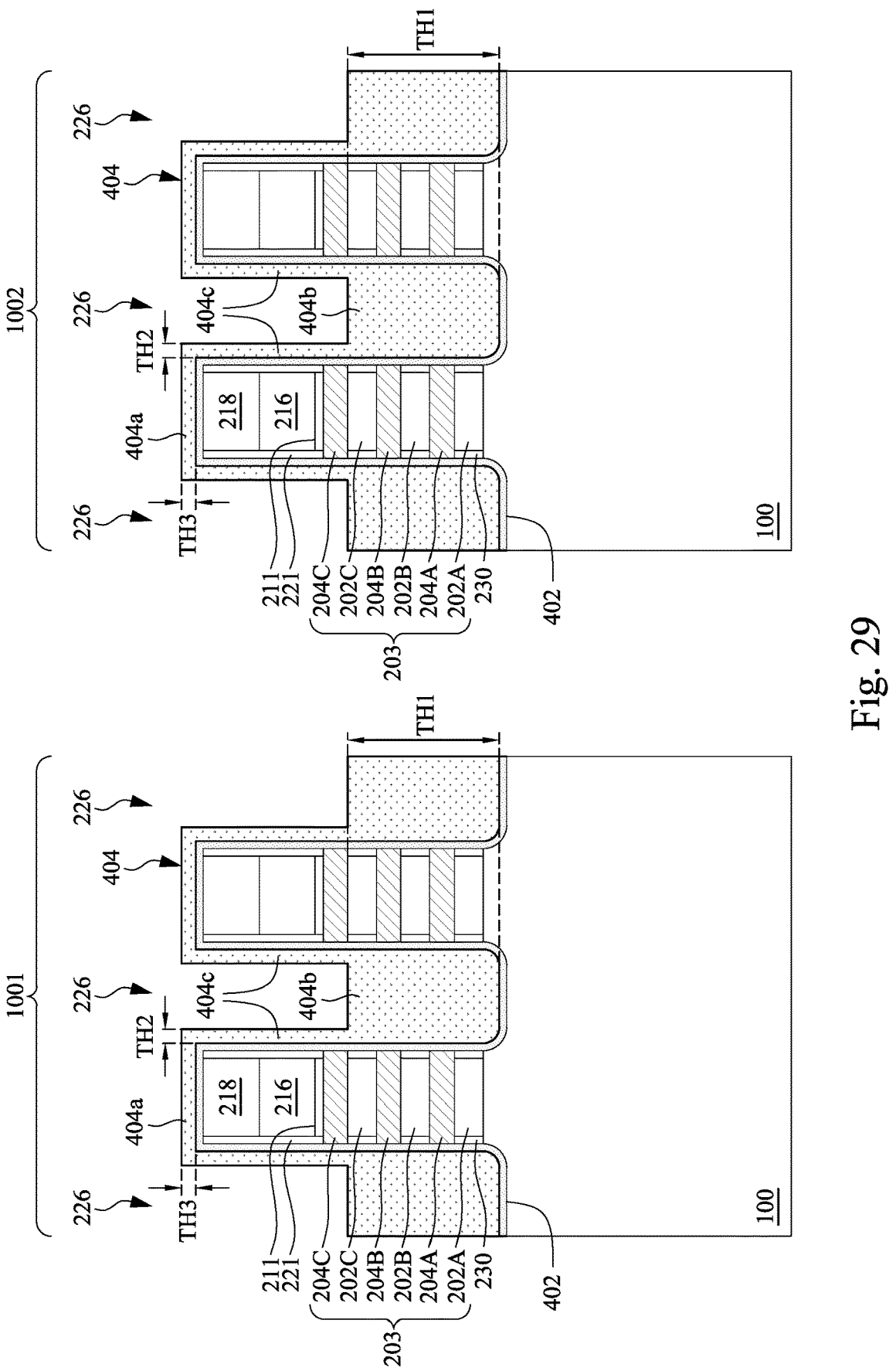

Reference is made to FIG. 29. A barrier layer 404 is formed on the passivation layer 402. The barrier layer 404 has a different etch selectivity than the passivation layer 402 during a subsequent etch process. For example, the barrier layer 404 may include $Si_3N_4$. The barrier layer 404 is formed using a bottom-up deposition method. The barrier layer 404 has a top portion 404a on the top of the masks 218, a bottom portion 404b within the bottom of the source/drain recesses 226, and a sidewall portion 404c extending along the sidewall of the source/drain recesses 226. The bottom portion 404b is thicker than the sidewall portion 404c and the top portion 404a. For example, the bottom portion 404b has a thickness TH1 along a vertical direction greater than a thickness TH2 of the sidewall portion 404c along a horizontal direction and a thickness TH3 of the top portion along the vertical direction. In some embodiments, the bottom-up deposition is performed using an anisotropic plasma treatment. For example, an ion driven deposition in which an ion bombardment by a plasma containing ions causing plasma reaction for deposition of the barrier layer 404 inside the source/drain recesses 226 as bottom-up fill. In an alternative embodiment, the barrier layer 404 is formed using PVD, FCVD, or ALD using an inhibitor such as $N_2$/Ar plasma to passivate surface. By depositing an inhibitor in the sidewalls of the source/drain recesses 226 and the passivation layer 402 over the top of the masks 218 which inhibits reaction products from accumulating on a surface of the sidewall of the source/drain recesses 226 and a surface of the top of the passivation layer 402 on the masks 218 that are covered with the inhibitor, while accumulating at the bottom of the source/drain recesses 226, achieving bottom-up fill as illustrated in FIG. 29.

Figure 30:
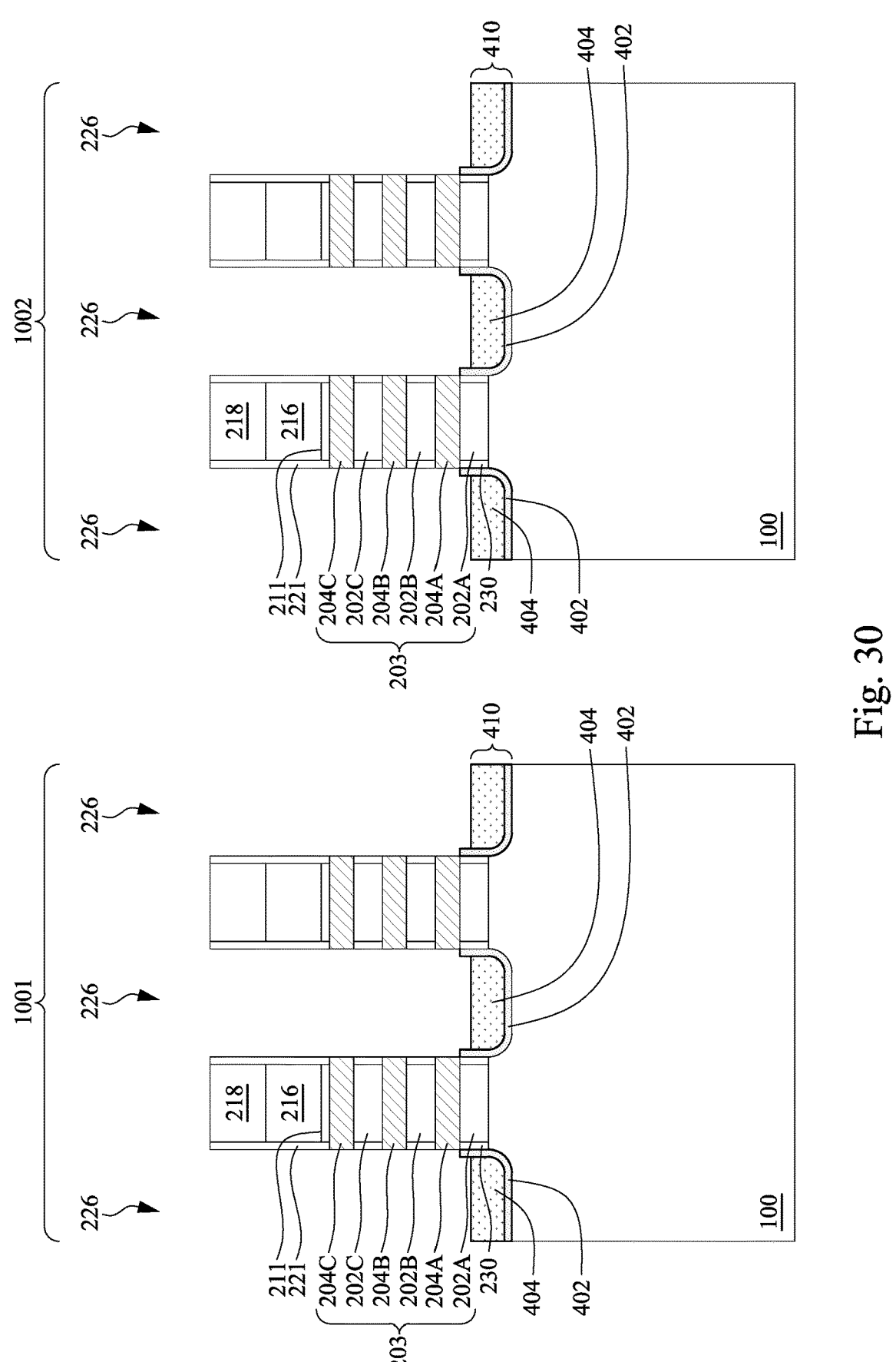

An etch process is performed to remove the top portion 404a, the sidewall portion 404c and a top of the bottom portion 404b of the barrier layer 404, exposing the passivation layer 402. In some embodiments, the etch process is a dry etch, a wet etch, or a combination thereof. Due to the barrier layer 404 having the different etch selectivity than the passivation layer 402, the passivation layer 402 acts as an etch stop layer during the etch process. For example, in the etch process, the passivation layer 402 is etched at a slower etch rate than the barrier layer 404. After the etch process, the exposed passivation layer 402 can be removed by an anisotropic etch, as discussed previously with regard to FIG. 14. The sidewalls of the source/drain recesses 226 and the top of the masks 218 are thus exposed. Remaining portions of the passivation layer 402 and the barrier layer 404 can collectively refer to as a barrier structure 410, as shown in FIG. 30. The passivation layer 404 has a U-shaped cross-section. In some embodiments, the passivation layer 402 has slanted top surfaces on opposite sides of the barrier layer 404, while the barrier layer 404 has a substantially flat top surface.

Figure 31:
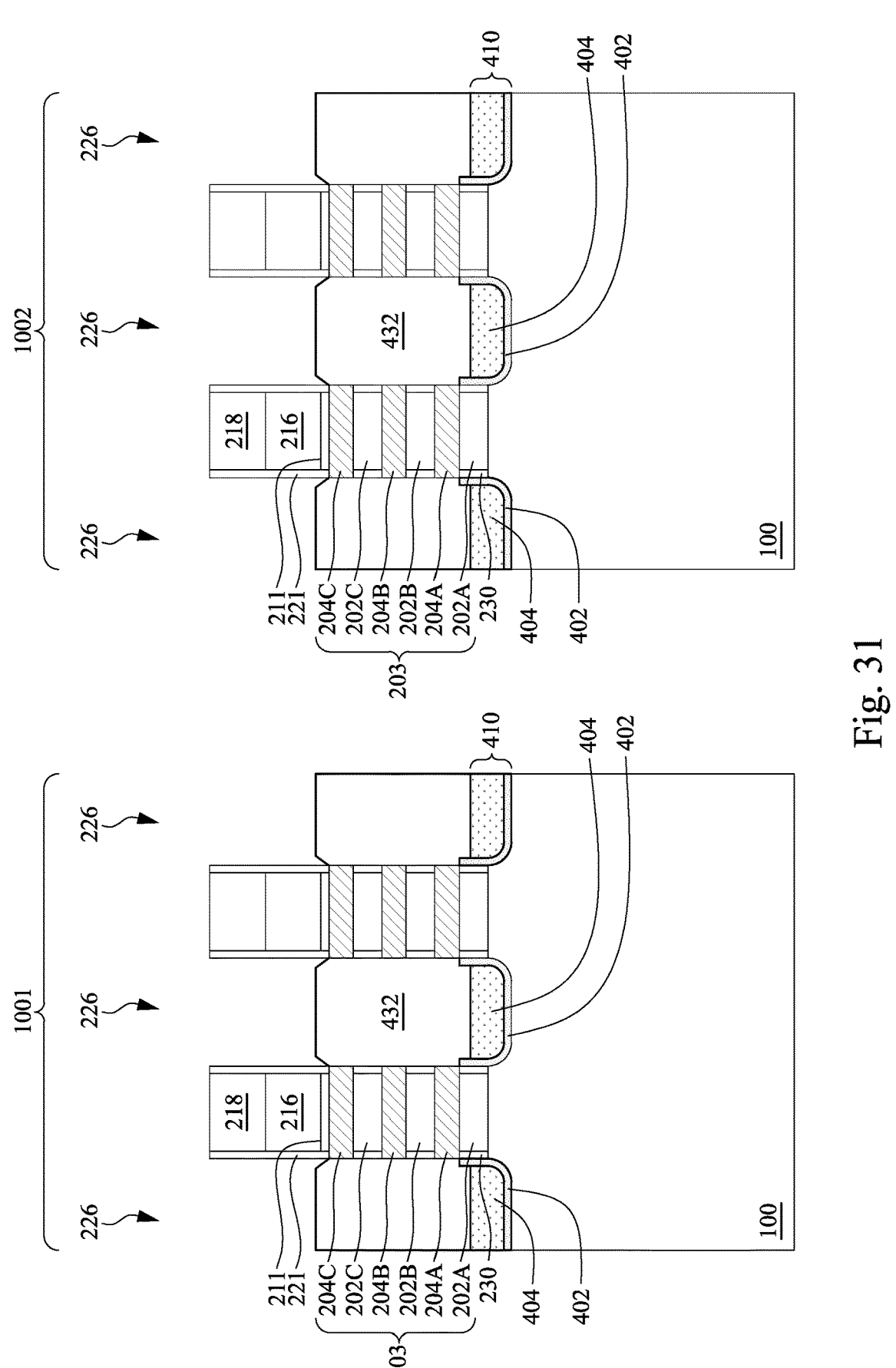

In FIG. 31, epitaxial source/drain regions 432 are formed over the barrier structure 410 in the source/drain recesses 226. The epitaxial source/drain regions 432 are vertically on the barrier structure 410. The epitaxial source/drain regions 432 are separated from the substrate 100 by the barrier structures 410. As discussed previously, by disposing the barrier structure 410, the epitaxial source/drain regions 432 are prevented from being in direct contact with the substrate 100. The barrier structure 410 provides full isolation of the epitaxial source/drain regions 432 from the substrate 100 or the fin, thereby reducing a mesa leakage between adjacent epitaxial source/drain regions 432 and a parasitic capacitance at the bottommost one of subsequently formed channels (such as the second nanostructures 204).

Figure 32:
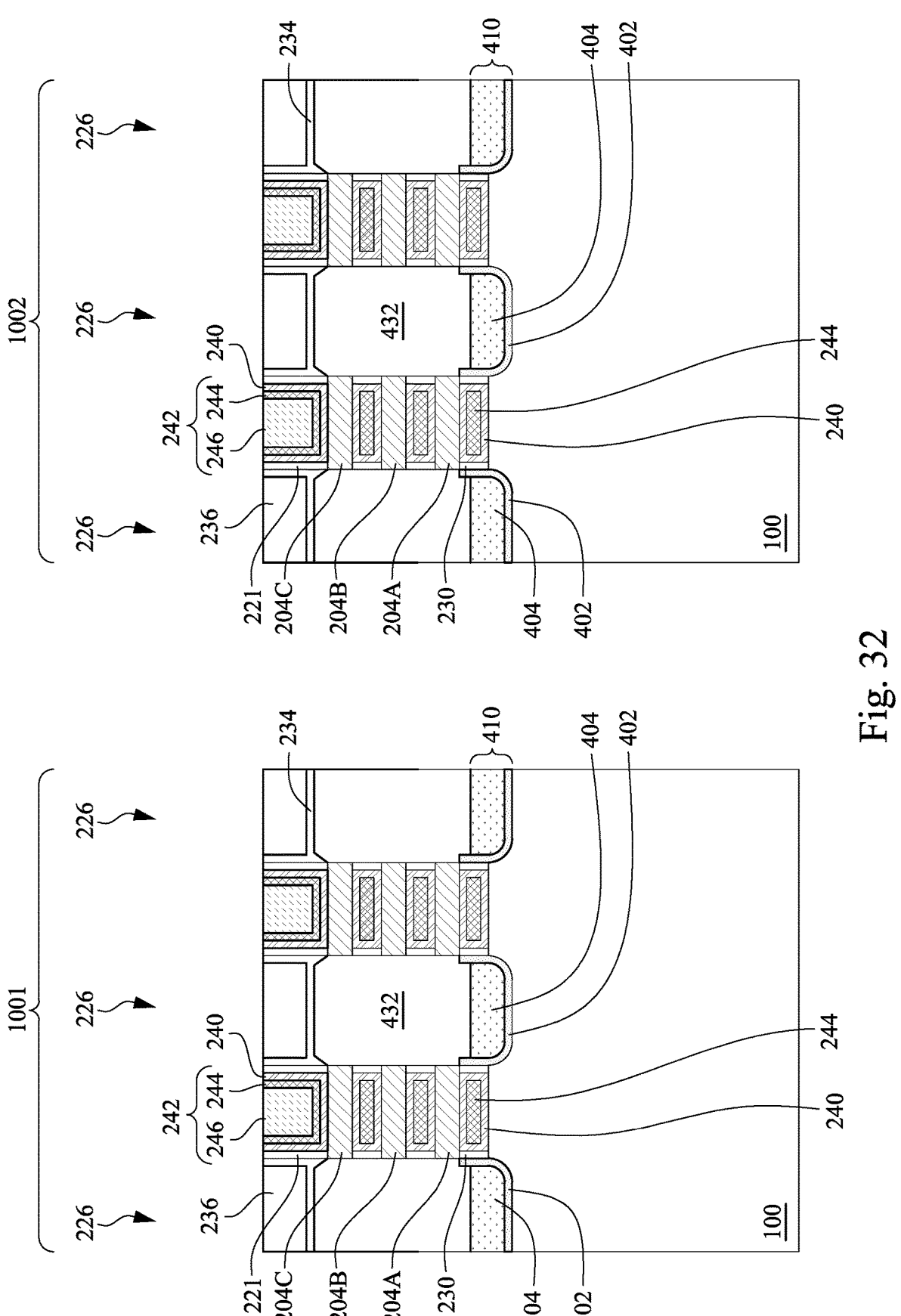

The CESL 234 and the ILD layer 236 are deposited over the structure in FIG. 31 followed by a planarization process, as discussed previously with regard to FIGS. 23B and 24B. The dummy gates 216 and the masks 218 are then removed to form gate trenches between corresponding first spacers 221, as discussed previously with regard to FIG. 25B. The first nanostructures 202 in the gate trenches are removed by an isotropic etching process such as wet etching or the like using etchants which are selective to the materials of the first nanostructures 202, as discussed previously with regard to FIG. 26B. Next, high-k/metal gate structures are formed, as discussed previously with regard to FIG. 27B. The resulting structure is shown in FIG. 32. The high-k/metal gate structure includes the gate dielectric layer 240 and the gate electrodes 242 which include the one or more work function layers 244 and the fill metal layer 246.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that by separating the epitaxial source/drain regions from the substrate or the fin with the barrier structure, full isolation of the epitaxial source/drain regions from the substrate or the fin, thereby effectively reducing a mesa leakage between adjacent source/drain regions and a parasitic capacitance at the bottommost one of subsequently formed channels. Another advantage is that by forming the passivation layer prior to forming the barrier layer, the selectively growth of the barrier layer is achieved. Yet another advantage is that by using the plasma deposition process to form the barrier layer in the recess, the reduced plasma dosage on the sidewall of the recess is beneficial for the selectively growth of the barrier layer.

In some embodiments, a semiconductor device includes a fin structure over a substrate, a metal gate stack across the fin structure, a barrier structure on opposite sides of the metal gate stack, wherein the barrier structure comprises one or more passivation layers and one or more barrier layers, and the one or more passivation layers have a material different from a material of the one or more barrier layers, and an epitaxial source/drain region over the barrier structure. In some embodiments, the one or more passivation layers and the one or more barrier layers are alternately stacked. In some embodiments, the one or more passivation layers include silicon oxide, and the one or more barrier layers include silicon nitride. In some embodiments, the one or more passivation layers have a lateral width greater than a lateral width of the one or more barrier layers. In some embodiments, the fin structure is separated from the one or more barrier layers by the one or more passivation layers. In some embodiments, the barrier structure has a top surface consisting of a top surface of the one or more passivation layers and a top surface of the one or more barrier layers.

In some embodiments, a method of forming a semiconductor device includes the following steps. A substrate is patterned to form a fin over the substrate. The fin is recessed to form a source/drain recess. A passivation layer is formed extending along a sidewall and directly over a bottom of the source/drain recess. A deposition process is performed to form a barrier layer on the passivation layer. The barrier layer has a different etch selectivity than the passivation layer. An epitaxial source/drain region is formed over the barrier layer. In some embodiments, the method further includes prior to forming the epitaxial source/drain region, removing a portion of the passivation layer from the sidewall of the source/drain recess. In some embodiments, the deposition process comprises an atomic layer deposition process by using silicon tetraiodide ($SiI_4$) and ammonia ($NH_3$) gases. In some embodiments, the deposition process is a bottom-up deposition method.

In some embodiments, a method of forming a semiconductor device includes the following steps. A fin is formed over a substrate, the fin comprising alternately stacked first semiconductor layers and second semiconductor layers. A gate stack is formed crossing the fin. A deposition cycle is repeated to form a barrier structure on opposite sides of the gate stack. The deposition cycle comprises conformally forming a passivation layer on the gate stack, the fin and the substrate. The passivation layer includes a top portion over a top surface of the gate stack, a bottom portion in contact with the substrate, and a lateral portion extending along a sidewall of the fin and a sidewall of the gate stack. A barrier layer is formed on the top portion and the bottom portion of the passivation layer. The lateral portion of the passivation layer is removed. An epitaxial source/drain region is formed on the opposite sides of the gate stack. In some embodiments, the passivation layer has a surface terminated with OH. In some embodiments, the passivation layer is an oxide layer, and the barrier layer is a nitride layer. In some embodiments, the method further includes after repeating the deposition cycle, performing a removal process to remove the top portion of the passivation layer and the barrier layer on the top portion of the passivation layer. In some embodiments, the removal process is an etch back process. In some embodiments, the removal process is a chemical mechanical polishing (CMP) process. In some embodiments, the method further comprises prior to performing the removal process, forming a protection layer on the barrier layer on the bottom portion of the passivation layer. In some embodiments, the protection layer is a photoresist. In some embodiments, the method further comprises after performing the removal process, removing the protection layer by an ashing process. In some embodiments, the epitaxial source/drain region vertically overlaps the barrier structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
  a fin structure over a substrate;
  a metal gate stack across the fin structure;
  a barrier structure on opposite sides of the metal gate stack, wherein the barrier structure comprises one or more passivation layers and one or more barrier layers, and the one or more passivation layers have a material different from a material of the one or more barrier layers, at least one of the one or more barrier layers is enclosed in the one or more passivation layers in a cross-sectional view; and an epitaxial source/drain region over the barrier structure.

2. The semiconductor device of claim 1, wherein the one or more passivation layers and the one or more barrier layers are alternately stacked.

3. The semiconductor device of claim 1, wherein the one or more passivation layers include silicon oxide, and the one or more barrier layers include silicon nitride.

4. The semiconductor device of claim 1, wherein the one or more passivation layers have a lateral width greater than a lateral width of the one or more barrier layers.

5. The semiconductor device of claim 1, wherein the fin structure is separated from the one or more barrier layers by the one or more passivation layers.

6. The semiconductor device of claim 1, wherein the barrier structure has a top surface consisting of a top surface of the one or more passivation layers and a top surface of the one or more barrier layers.

7. A method of forming a semiconductor device, comprising:

patterning a substrate to form a fin over the substrate;

recessing the fin to form a source/drain recess;

forming a passivation layer extending along a sidewall and directly over a bottom of the source/drain recess;

performing a deposition process to form a barrier layer on the passivation layer, wherein the barrier layer has a different etch selectivity than the passivation layer; and forming an epitaxial source/drain region over the barrier layer and the passivation layer, wherein the epitaxial source/drain region interfaces with a top of the passivation layer at a first level and interfaces with a top of the barrier layer at a second level different from the first level.

8. The method of claim 7, further comprising:

prior to forming the epitaxial source/drain region, removing a portion of the passivation layer from the sidewall of the source/drain recess.

9. The method of claim 7, wherein the deposition process comprises an atomic layer deposition process by using silicon tetraiodide ($SiI_4$) and ammonia ($NH_3$) gases.

10. The method of claim 7, wherein the deposition process is a bottom-up deposition method.

11. A method of forming a semiconductor device, comprising:

forming a fin over a substrate, the fin comprising alternately stacked first semiconductor layers and second semiconductor layers;

forming a gate stack crossing the fin;

repeating a deposition cycle to form a barrier structure on opposite sides of the gate stack, the deposition cycle comprising:

conformally forming a passivation layer on the gate stack, the fin and the substrate, wherein the passivation layer includes a top portion over a top surface of the gate stack, a bottom portion in contact with the substrate, and a lateral portion extending along a sidewall of the fin and a sidewall of the gate stack;

forming a barrier layer on the top portion and the bottom portion of the passivation layer; and removing the lateral portion of the passivation layer; and forming an epitaxial source/drain region on the opposite sides of the gate stack.

12. The method of claim 11, wherein the passivation layer has a surface terminated with OH.

13. The method of claim 11, wherein the passivation layer is an oxide layer, and the barrier layer is a nitride layer.

14. The method of claim 11, further comprising:

after repeating the deposition cycle, performing a removal process to remove the top portion of the passivation layer and the barrier layer on the top portion of the passivation layer.

15. The method of claim 14, wherein the removal process is an etch back process.

16. The method of claim 14, wherein the removal process is a chemical mechanical polishing (CMP) process.

17. The method of claim 14, further comprising:

prior to performing the removal process, forming a protection layer on the barrier layer on the bottom portion of the passivation layer.

18. The method of claim 17, wherein the protection layer is a photoresist.

19. The method of claim 17, further comprising:

after performing the removal process, removing the protection layer by an ashing process.

20. The method of claim 11, wherein the epitaxial source/drain region vertically overlaps the barrier structure.

* * * * *